United States Patent [19]

Iwai et al.

[11] Patent Number: 5,829,939
[45] Date of Patent: Nov. 3, 1998

[54] TREATMENT APPARATUS

[75] Inventors: Hiroyuki Iwai, Sagamihara; Tamotsu Tanifuji, Yamato; Takanobu Asano, Yokohama; Ryoichi Okura, Kanagawa-Ken, all of Japan

[73] Assignee: Tokyo Electron Kabushiki Kaisha, Tokyo, Japan

[21] Appl. No.: 667,584

[22] Filed: Jun. 24, 1996

Related U.S. Application Data

[62] Division of Ser. No. 583,669, Jan. 5, 1996, Pat. No. 5,562, 383, which is a division of Ser. No. 226,255, Apr. 11, 1994, abandoned.

[30] Foreign Application Priority Data

| Apr. 13, 1993 | [JP] | Japan | ..... | 5-86339 |
| Dec. 3, 1993 | [JP] | Japan | ..... | 5-339529 |

[51] Int. Cl.⁶ ............................................. H01L 21/00
[52] U.S. Cl. .................. 414/411; 414/416; 414/937; 414/940
[58] Field of Search .................. 414/217, 411, 414/416, 277, 937, 939, 940; 118/719; 204/298.25, 298.35

[56] References Cited

U.S. PATENT DOCUMENTS

| 4,649,830 | 3/1987 | Tanaka ................................ 414/940 X |
| 4,676,709 | 6/1987 | Bonora et al. ........................... 414/217 |
| 4,687,542 | 8/1987 | Davis et al. ......................... 414/411 X |
| 4,724,874 | 2/1988 | Parikh et al. ........................ 414/217 X |
| 4,739,882 | 4/1988 | Parikh et al. ........................ 414/217 X |
| 4,802,809 | 2/1989 | Bonora et al. ........................... 414/217 |
| 4,815,912 | 3/1989 | Maney et al. ............................. 414/217 |
| 4,826,360 | 5/1989 | Iwasawa et al. ..................... 414/939 X |
| 4,904,153 | 2/1990 | Iwasawa et al. ..................... 414/940 X |
| 4,923,352 | 5/1990 | Tamura et al. ....................... 414/940 X |
| 4,966,519 | 10/1990 | Davis et al. ......................... 414/939 X |
| 5,048,164 | 9/1991 | Harima ............................... 414/940 X |

(List continued on next page.)

FOREIGN PATENT DOCUMENTS

| 552756 | 7/1993 | European Pat. Off. ............... 414/940 |
| 300524 | 12/1988 | Japan .................................... 414/940 |
| 30213 | 2/1989 | Japan .................................... 414/940 |
| 172203 | 7/1991 | Japan .................................... 414/940 |
| 345049 | 12/1992 | Japan .................................... 414/940 |
| 105206 | 4/1993 | Japan .................................... 414/940 |
| 2265634 | 10/1993 | United Kingdom ................... 414/940 |
| WO91/0210 | 5/1991 | WIPO ................................... 414/940 |

Primary Examiner—David A. Bucci
Attorney, Agent, or Firm—Beveridge, DeGrandi, Weilacher & Young, LLP

[57] ABSTRACT

A treatment apparatus comprises a treatment chamber for performing a treatment for a workpiece W, a loading chamber connected to the treatment chamber, for loading and unloading a holding member which contains the workpiece into and from the treatment chamber, and an input/output chamber for inputting and outputting the workpiece to and from the loading chamber. The input/output chamber includes a cassette accommodating vessel port which holds a cassette accommodating vessel. The vessel is filled with clean air or an inert gas, and is airtightly closed. A cassette receiving mechanism is disposed below the port and lowers only the cassette of the vessel so as to receive the cassette. Thus, when the cassette is input and output to and from the outside of the treatment apparatus, the workpiece contained within the cassette is not exposed to the atmosphere in a working region. Consequently, it is not necessary to improve the cleanliness level of the atmosphere in the working region. As a result, the construction cost of the clean room and the operation cost thereof can be reduced. A clean air blowing device is disposed below the port. The clean air blowing device blows a side flow of clean air. Thus, the atmosphere at a position below the port where air tends to stay is circulated. Thus, since the surface of the workpiece loaded in the treatment chamber is exposed to the side flow, particles and the like that adhere thereto are purged.

2 Claims, 20 Drawing Sheets

U.S. PATENT DOCUMENTS

| | | | |
|---|---|---|---|
| 5,145,303 | 9/1992 | Clarke | 414/939 X |
| 5,221,201 | 6/1993 | Yamagawa et al. | 414/940 X |
| 5,225,691 | 7/1993 | Powers et al. | 414/437 X |
| 5,261,935 | 11/1993 | Ishii et al. | 414/217 X |
| 5,273,423 | 12/1993 | Shiraiwa | 414/939 X |
| 5,277,579 | 1/1994 | Takanabe | 414/939 X |
| 5,399,531 | 3/1995 | Wu | 414/939 X |
| 5,431,600 | 7/1995 | Murata et al. | 414/411 X |
| 5,433,574 | 7/1995 | Kawano et al. | 414/416 X |
| 5,433,785 | 7/1995 | Saito | 414/937 X |
| 5,468,112 | 11/1995 | Ishii et al. | 414/939 X |
| 5,509,772 | 4/1996 | Doche | 414/939 X |

TREATMENT APPARATUS

This application is a divisional application of U.S. patent application Ser. No. 08/583,669 filed on Jan. 5, 1996, and which issued as U.S. Pat. No. 5,562,383 on Oct. 8, 1996, which in turn was a divisional application of U.S. patent application Ser. No. 08/226,255 filed on Apr. 11, 1994, now abandoned, which application is entirely incorporated herein by reference.

BACKGROUND OF THE INVENTION

1. Field of the Invention

The present invention relates to a treatment apparatus for performing a predetermined treatment for a workpiece such as a semiconductor wafer.

2. Description of the Related Art

In semiconductor fabrication processes, various treatment apparatuses that form an oxide film on a semiconductor wafer, which is a workpiece, form a thin film on a semiconductor wafer corresponding to heat CVD method, and form impurity regions with different concentrations on a semiconductor wafer corresponding to heat diffusion method have been used. In the following description, the semiconductor wafer may be referred to as simply a wafer.

In recent years, upright type heat treatment apparatuses have been widely used instead of conventional flat type heat treatment apparatuses. As an example of the upright type heat treatment apparatuses, a wafer boat (which serves as a holding member) that contains a large number of wafers is loaded into a nearly-cylindrical upright type treatment chamber (process tube). The inside of the process tube is heated in an atmosphere of a predetermined treatment gas so as to perform various treatments for the wafers.

In the conventional heat treatment apparatus of this type, a manifold is disposed below the process tube (that is made of quartz or the like). An exhaust pipe and a delivery pipe are disposed on the manifold so as to exhaust waste gas therefrom and to deliver clean gas thereto. A heater is disposed around the process tube so as to heat the inside thereof at a desired temperature.

The wafer boat, which contains a large number of wafers, is transferred from a loading chamber to the process tube by a boat elevator that constructs a transfer mechanism. At this point, a flange of the wafer boat is brought into contact with the manifold so as to airtightly close the inside of the process tube.

An input/output means is disposed in a transfer chamber adjacent to the loading chamber. The input/output means inputs and outputs the wafers accommodated in a wafer carrier to and from the wafer boat.

When the wafers are treated by the heat treatment apparatus, they are contained in the wafer boat in an atmosphere of an inert gas (such as nitrogen $N_2$), namely an atmosphere of non-oxygen. The wafer boat is raised and loaded into the process tube by the boat elevator. Thereafter, the $N_2$ gas is exhausted through the exhaust pipe. When the inside of the process tube becomes a vacuum of a predetermined level, a treatment gas is delivered into the process tube through the delivery pipe so as to perform a desired treatment. In the above-described conventional apparatus, a load lock chamber construction where the inside of the loading chamber is airtightly closed and air and gas are exhausted therefrom has been used. As another construction of the apparatuses, the inside of the loading chamber is always kept at the pressure of an atmosphere of clean air.

In the above-described upright type heat treatment apparatuses, when the wafer carrier is input and output to and from the transfer chamber, which accommodates the wafer carrier, a door disposed on the transfer chamber is opened and closed, respectively. The wafer carrier is transferred to the vacuum chamber by an automatic guided vehicle (AGV) or the operator in the condition that the wafers contained in the wafer carrier are exposed to clean air. In addition, the wafers that have been treated are output from the vacuum chamber in the condition that the wafers are exposed to the clean air.

Thus, the outside of the transfer chamber (namely the entire clean room in which the operator and the like work) should be kept at a cleanliness level equal to or close to the cleanliness level of the transfer chamber and the loading room (for example, class 1) so as to prevent particles from adhering to the wafers.

When the clean room is constructed, the construction cost of the clean room is proportional to the cleanliness level thereof. Thus, if the working regions for the wafer carrier, the operator, and the like were constructed with such a high cleanliness level, the construction cost would remarkably increase.

In addition, since the large clean room should be kept with the high cleanliness level, the running cost thereof will also increase.

SUMMARY OF THE INVENTION

The present invention is made from the above-described point of view. An object of the present invention is to provide a treatment apparatus having a cassette accommodating vessel such as SMIF (Standard Mechanical InterFace) pot so as to reduce the cleanliness level.

A first aspect of the present invention is a treatment apparatus, comprising a treatment chamber for performing a predetermined treatment for a workpiece contained in a holding member, a loading chamber having a transfer mechanism for loading and unloading the holding member containing the workpiece into and from the treatment chamber, an input/output chamber for transferring a cassette containing the workpiece and for inputting and outputting the workpiece contained in the cassette to and from the loading chamber, a cassette accommodating vessel port for connecting the input/output chamber and an outside thereof and for holding a cassette accommodating vessel conveyed from the outside, the cassette accommodating vessel being adapted to accommodate the cassette, a cassette receiving mechanism disposed in the input/output chamber for receiving the cassette from the cassette accommodating vessel held on the cassette accommodating vessel port to the inside the input/output chamber, and a clean air blowing means disposed in the input/output chamber, for blowing a side flow of clean air into the cassette transferred by the cassette receiving mechanism.

A second aspect of the present invention is a treatment apparatus, comprising a treatment chamber for performing a predetermined treatment for a workpiece contained in a holding member, a loading chamber having a transfer mechanism for loading and unloading the holding member containing the workpiece into and from the treatment chamber, an input/output chamber for transferring a cassette accommodating vessel accommodating a cassette and for inputting and outputting the workpiece contained in the cassette to and from the loading chamber, a cassette accommodating vessel port for connecting the input/output chamber and an outside thereof and for holding a cassette accommodating vessel conveyed from the outside, receive means disposed in the input/output chamber, for receiving the cassette accommodating vessel held on the cassette accommodating vessel port to the inside of the input/output chamber, a cassette extracting stage disposed between the input/output chamber and the loading chamber, for extracting the cassette from the cassette accommodating vessel, and vessel transfer means disposed in the input/output chamber, for transferring the cassette accommodating vessel received by the receive means to the cassette extracting stage.

A third aspect of the present invention is a treatment apparatus, comprising a treatment chamber for performing a predetermined treatment for a workpiece contained in a holding member, a loading chamber for loading and unloading the holding member containing the workpiece into and from the treatment chamber, a pass box for temporarily storing an accommodating vessel conveyed from the outside of the treatment apparatus, the accommodating vessel including a main body and a lid, and airtightly contain the workpiece, a gas supply/exhaust means for substituting the atmosphere in the pass box with an inert gas, a lid removing mechanism disposed in the pass box and for removing the lid from the main body of the accommodating vessel, and transferring means for transferring the workpiece contained in the accommodating vessel to the loading chamber.

A fourth aspect of the present invention is a treatment apparatus, comprising a treatment chamber for performing a predetermined treatment for a workpiece contained in a holding member, a loading chamber communicating with the outside of the treatment chamber through an inlet/outlet opening, for loading and unloading the holding member into and from the treatment chamber, a box holding mechanism holding an accommodating vessel having a main body and a lid from the outside of the loading chamber so as to close the inlet/outlet opening with the lid, the accommodating vessel airtightly containing the workpiece a lid removing door mechanism for normally closing the inlet/outlet opening from the inside of the loading chamber and for removing the lid of the accommodating vessel held by the box holding mechanism so as to make the inside of the accommodating vessel communicate with the inside of the loading chamber, and a transfer means for transferring the workpiece contained in the accommodating vessel held at the inlet/outlet opening to the loading chamber.

According to the first aspect of the present invention, when the workpieces are input and output to and from the input/output chamber, the cassette accommodating vessel, which is airtightly sealed from the outer atmosphere, is placed in the cassette accommodating vessel port. The cassette containing the workpieces is accommodated in the cassette accommodating vessel. The cassette accommodating vessel placed at the port is received to the input/output chamber by the cassette receiving mechanism. When the cassette is transferred to the input/output chamber, the clean air blowing means disposed on a side portion thereof forces a side flow of clean air into the workpieces contained in the cassette, thereby purging particles that adhere to the workpieces and the atmosphere that stays below the port. Consequently, it is not necessary to remarkably improve the cleanliness level of the working region where the cassette is transferred between apparatuses and the operator works. As a result, the construction cost of the clean room can be reduced.

According to the second aspect of the present invention, when the workpieces are input and output to and from the input/output chamber, the cassette accommodating vessel that is airtightly sealed from the outer atmosphere is placed at the cassette accommodating vessel port in the input/output chamber. The accommodating vessel placed at the port is received to the apparatus by the receiving means. The accommodating vessel is transferred to the cassette extracting stage by the vessel transfer means. The cassette, which contains the workpieces, is extracted from the cassette accommodating vessel. The cassette is transferred to the treatment chamber through the loading chamber. After the workpieces have been treated, the treated workpieces are contained in the cassette. The cassette is accommodated in the cassette accommodating vessel. The cassette accommodating vessel, which is airtightly sealed from the outer atmosphere is conveyed from the cassette accommodating vessel port to the outside of the treatment apparatus. Thus, since the workpieces are not exposed to the atmosphere in the working region, where the operator works, it is not necessary to remarkably improve the cleanliness level of the working region. In addition, it is not necessary to prepare an area for an empty cassette accommodating vessel.

According to the third aspect of the present invention, when the accommodating vessel is transferred from the outside to the pass box, it is temporarily exposed to the atmosphere. However, inert gas is supplied to the pass box by the gas supply/exhaust means, thereby purging air and impurities that adhere to the outer surface of the accommodating vessel. Since the capacity of the pass box can be small, with a relatively small amount of gas supplied from the gas supply/exhaust means, air can be quickly substituted with inert gas having a high purity. In the atmosphere of inert gas, the lid of the accommodating vessel is opened by the lid removing mechanism. The accommodating vessel, which contains the workpieces, is transferred to the treatment chamber of the treatment apparatus main body, which is filled with the atmosphere of inert gas. In the treatment chamber, a predetermined treatment operation is preformed. Thus, the workpieces can be input and output to and from the treatment apparatus in the atmosphere of inert gas without being exposed to air. Consequently, air ($O_2$), gas impurities, and particle impurities can be easily and securely prevented from adhering to the workpieces and from entering the treatment apparatus.

According to the fourth aspect of the present invention, the accommodating vessel that contains the workpieces in the atmosphere of inert gas is airtightly connected to the workpiece input/output opening of the loading chamber by the box holding mechanism. In this condition, the lid of the workpiece transfer box is removed by the lid removing door mechanism of the apparatus main body. Thus, the accommodating vessel is opened to the inside of the treatment apparatus main body. Consequently, the accommodating vessel is airtightly connected to the treatment apparatus main body. As a result, the workpieces in the accommodating vessel are transferred to the treatment chamber of the treatment apparatus main body. In the treatment chamber, a predetermined treatment operation is performed.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

First Embodiment

Next, with reference to FIGS. 1 to 10, a first embodiment of the present invention will be described.

In this embodiment, the present invention is applied to a heat treatment apparatus for semiconductor wafers.

Figure 1:
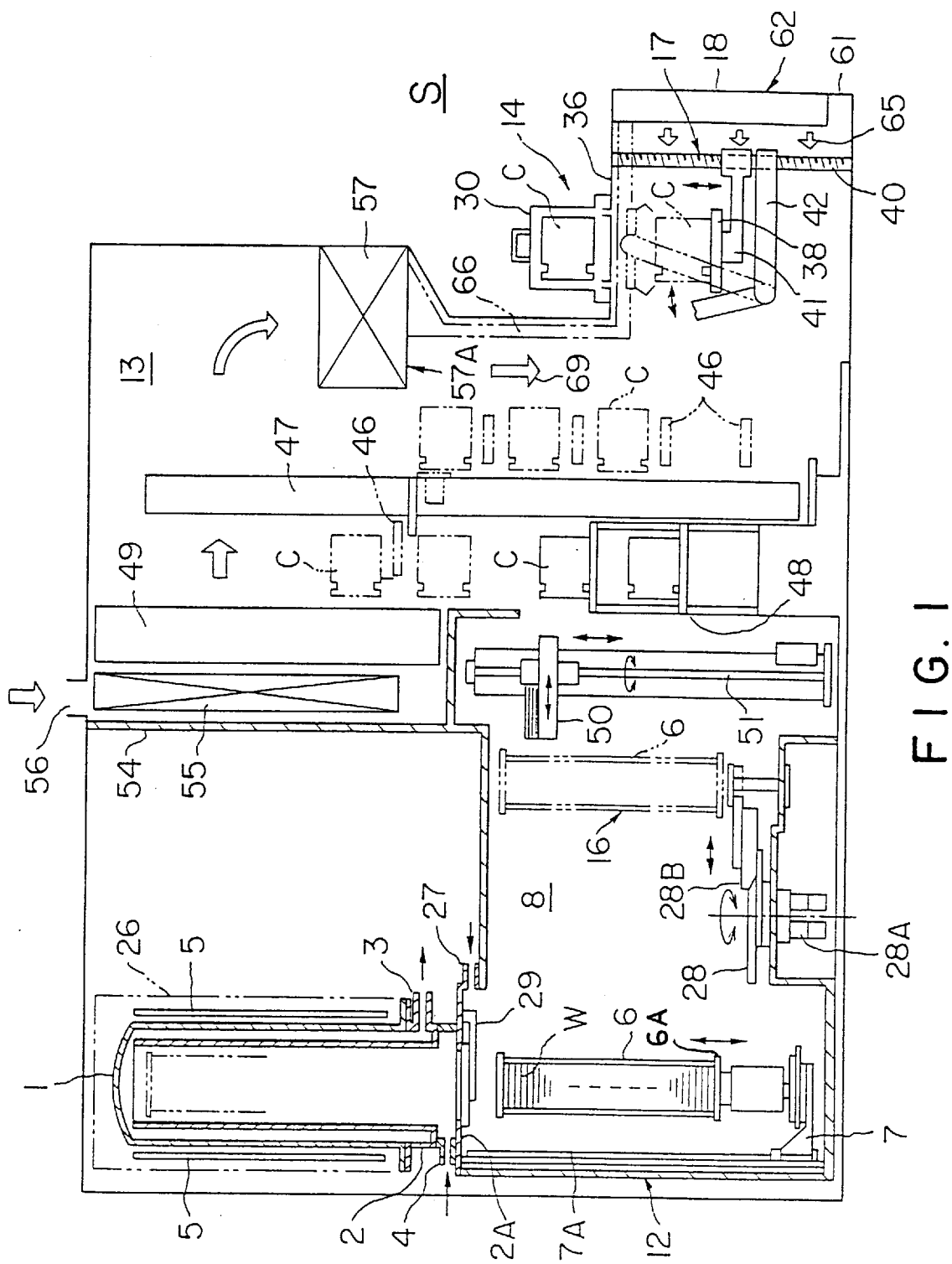
FIG. 1 is a schematic sectional view showing a treatment apparatus according to a first embodiment of the present invention.
Figure 2:
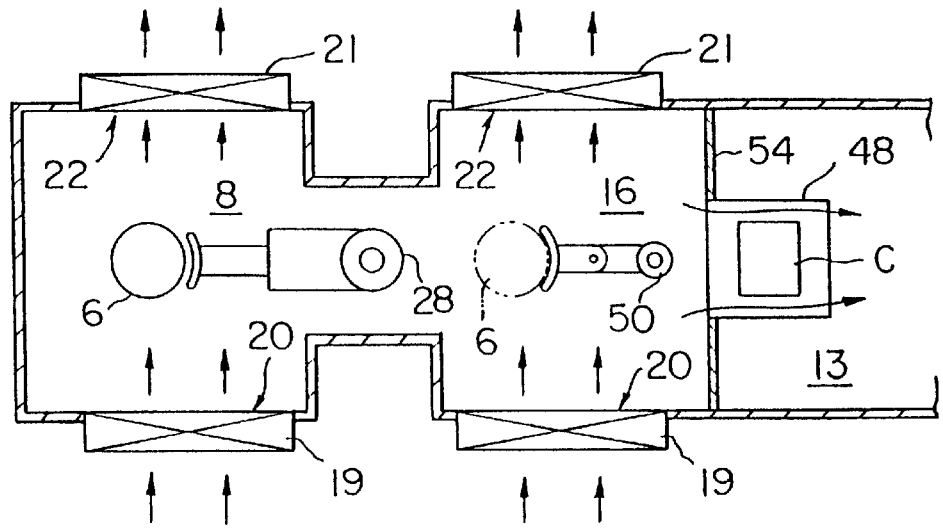
FIG. 2 is a schematic plan view showing the treatment apparatus.
Figure 3:
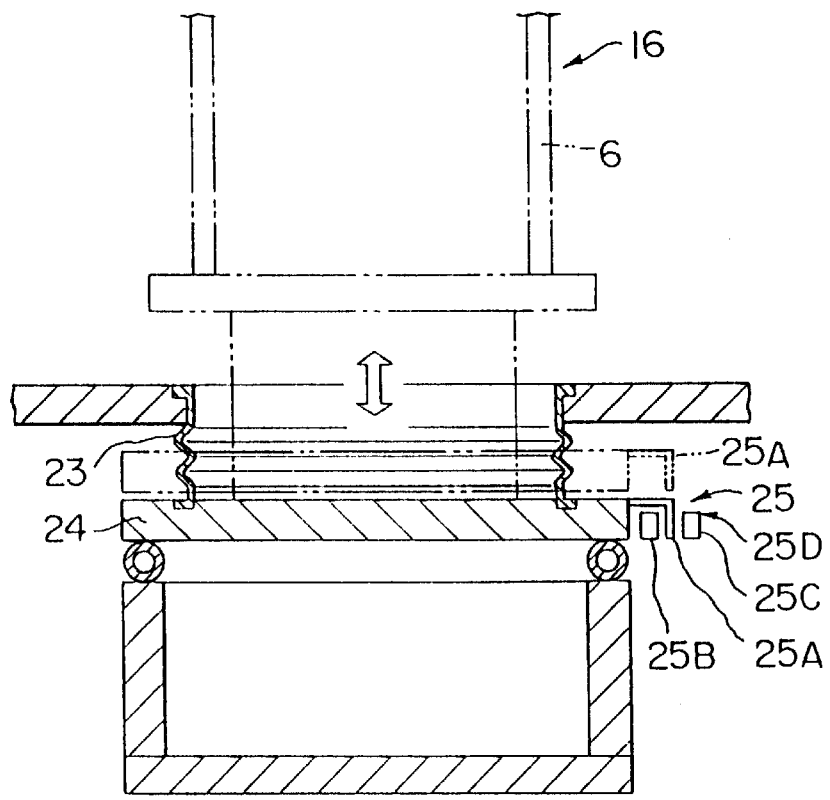
FIG. 3 is a sectional view showing a holding member accommodating chamber according to the first embodiment of the present invention.
Figure 4:
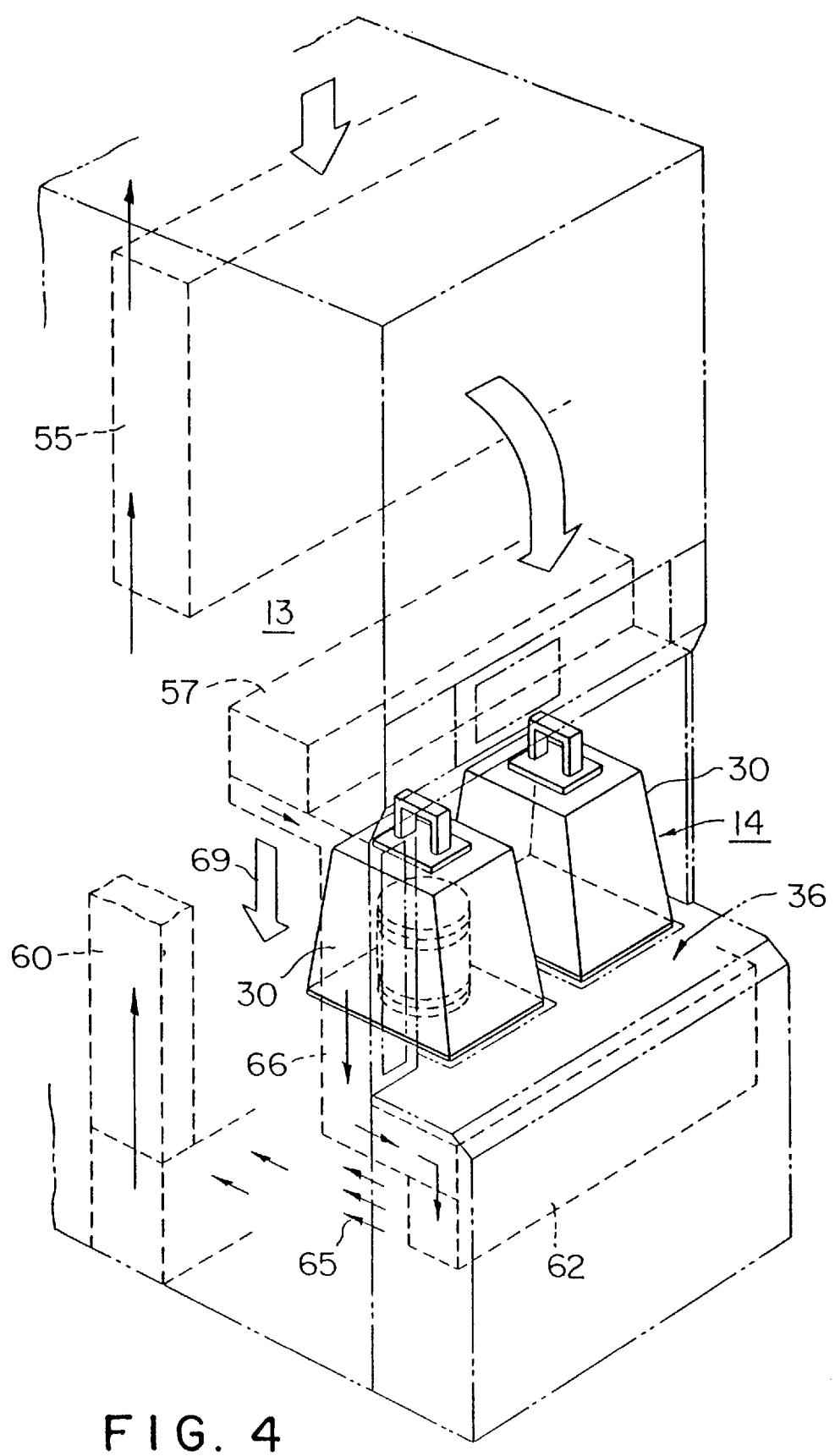
FIG. 4 is a perspective view showing the front of the treatment apparatus according to the first embodiment of the present invention.
Figure 5:
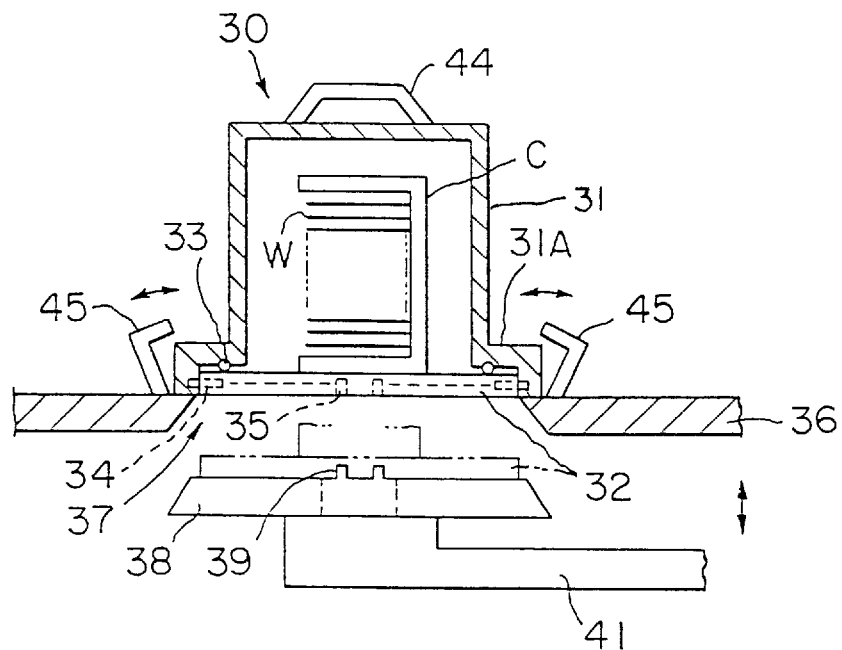
FIG. 5 is a sectional view showing a cassette accommodating vessel port.
Figure 6:
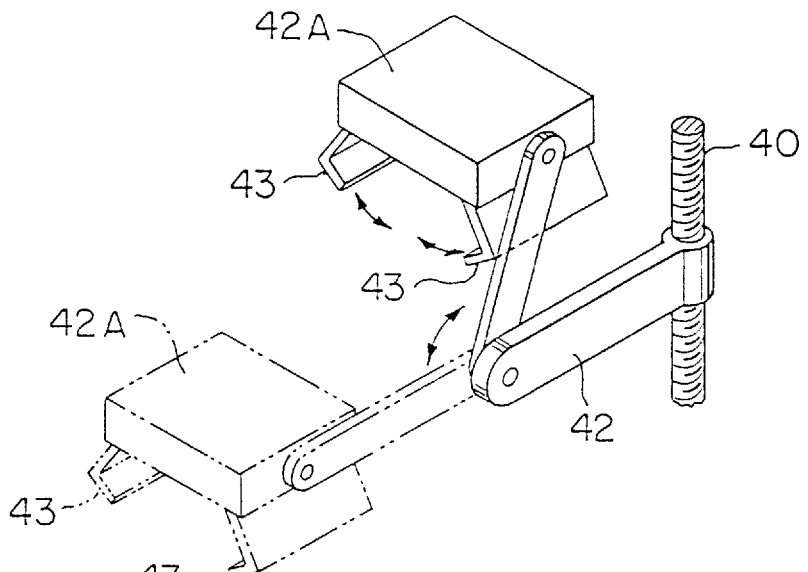
FIG. 6 is a perspective view showing a cassette horizontal moving mechanism.
Figure 7A:
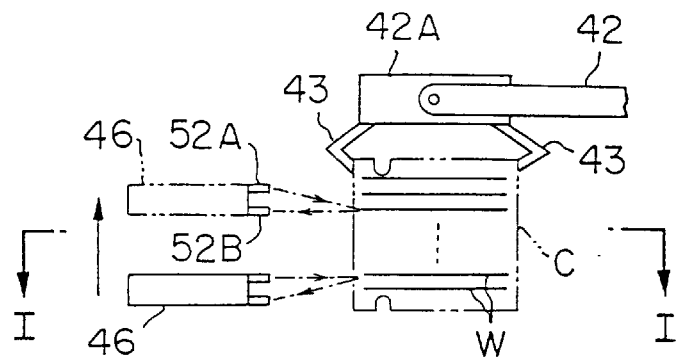
FIG. 7A is a side view showing a wafer counter disposed on a carrier transfer.
Figure 7B:
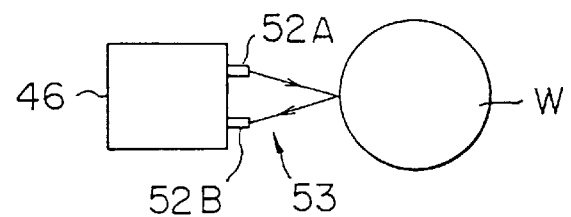
FIG. 7B is a view taken along line I—I of FIG. 7A.
Figure 8:
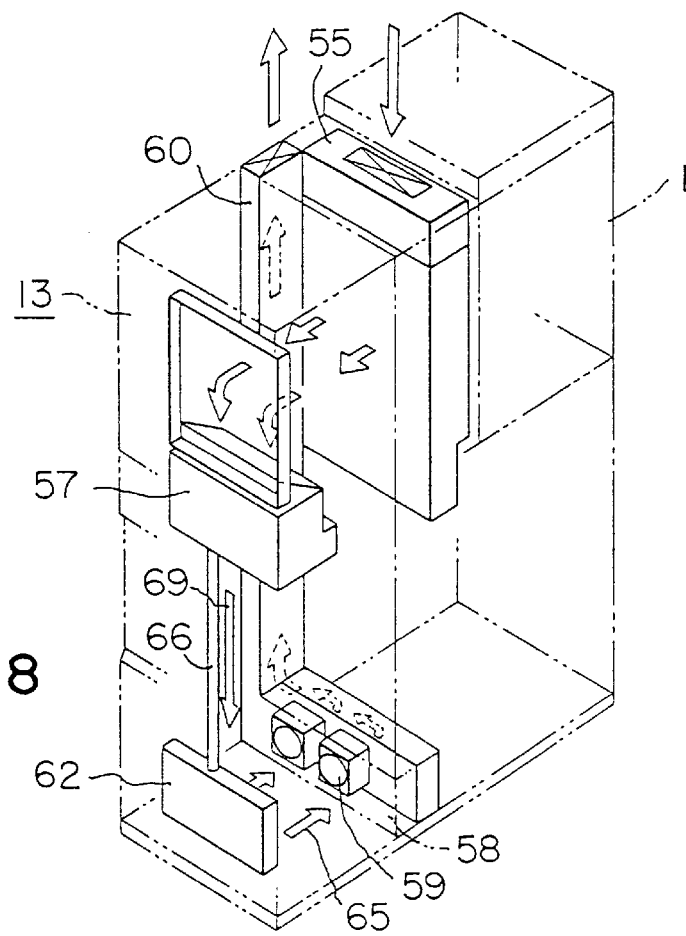
FIG. 8 is an exploded view showing a flow of clean air in an input/output chamber.
Figure 9:
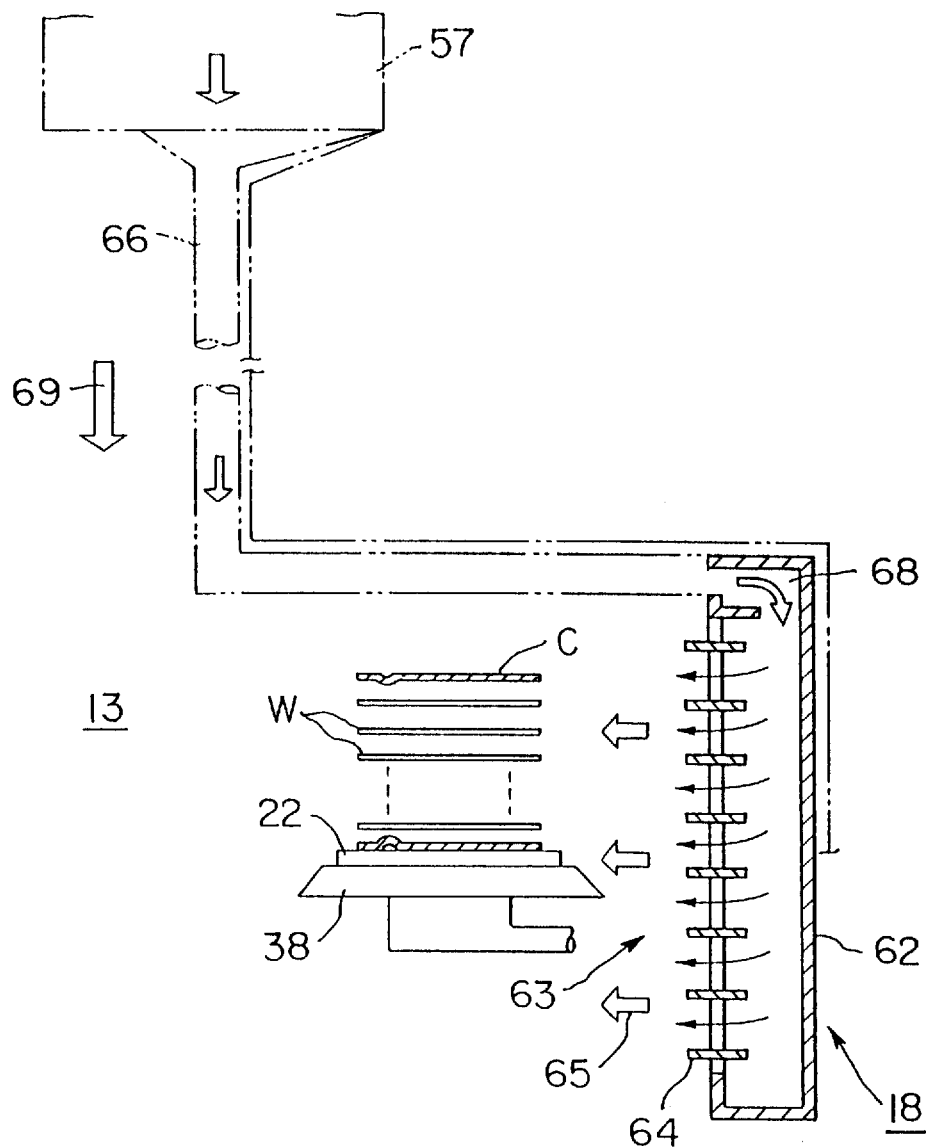
FIG. 9 is a side sectional view showing the relation between a clean air blowing means and a cassette in the input/output chamber.
Figure 10:
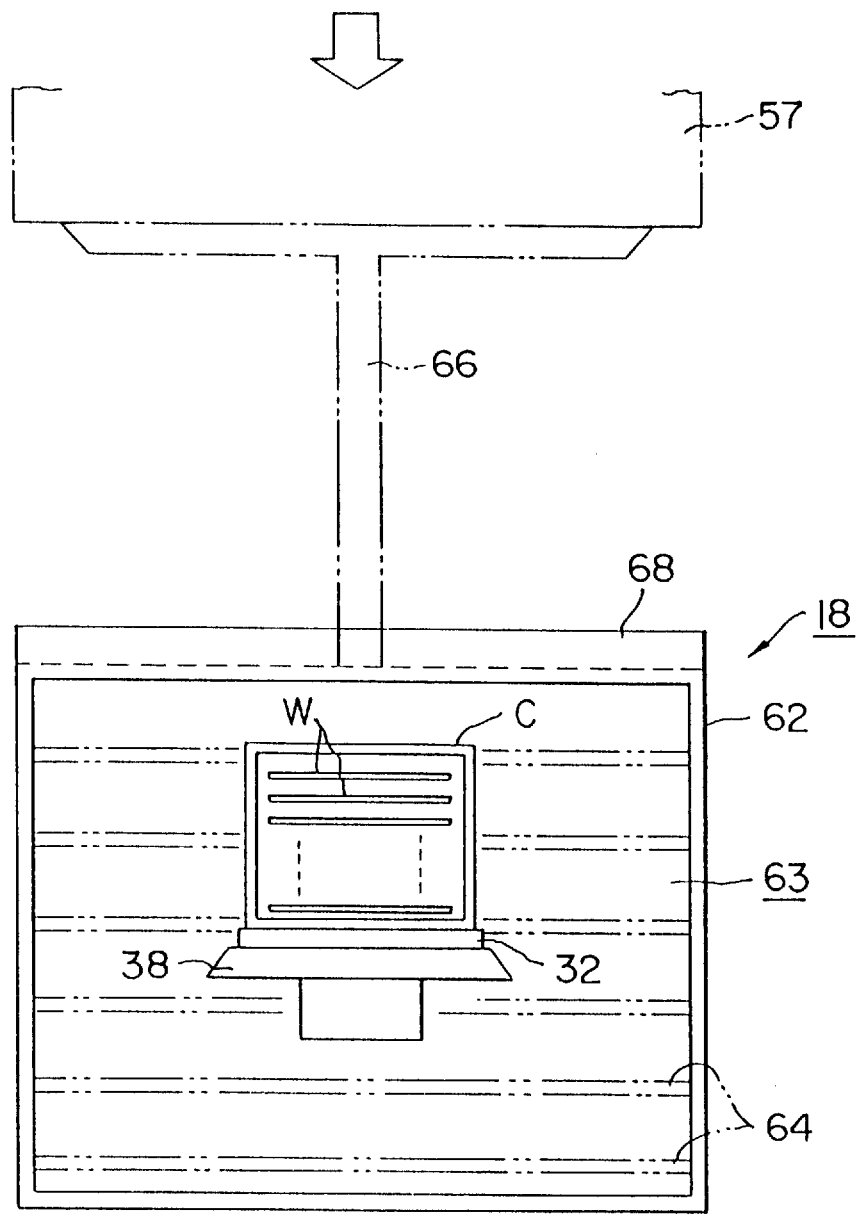
FIG. 10 is a plan view of FIG. 9.

FIG. 1 is a schematic sectional view showing a treatment apparatus according to a first embodiment of the present invention; FIG. 2 is a schematic plan view showing the treatment apparatus; FIG. 3 is a sectional view showing a holding member accommodating chamber according to the first embodiment of the present invention; FIG. 4 is a perspective view showing the front of the treatment apparatus according to the first embodiment of the present invention; FIG. 5 is a sectional view showing a cassette accommodating vessel port; FIG. 6 is a perspective view showing a cassette horizontal moving mechanism; FIG. 7A is a side view showing a wafer counter disposed on a carrier transfer; FIG. 7B is a view taken along line B—B of FIG. 7A; FIG. 8 is an exploded view showing a flow of clean air in an input/output chamber; FIG. 9 is a side sectional view showing the relation between a clean air blowing means and a cassette in the input/output chamber; and FIG. 10 is a plan view of FIG. 9.

The treatment apparatus according to the first embodiment of the present invention comprises a process tube 1, a loading chamber 8, an input/output chamber 13, a cassette accommodating vessel port 14, and a holding member accommodating chamber 16. The process tube 1 is a treatment chamber that performs a predetermined treatment for a wafer W that is a workpiece. The loading chamber 8 has a transfer mechanism 12 that loads and unloads a wafer boat 6 into and from the process tube 1. The wafer boat 6 serves as a holding member that contains a large number of (for example, 100) wafers W. The input/output chamber 13 inputs and outputs the wafers W to and from the loading chamber B. The cassette accommodating vessel port 14 is disposed in the input/output chamber 13. The holding member accommodating chamber 16 is disposed between the loading chamber 8 and the input/output chamber 13. The holding member accommodating chamber 16 accommodates the wafer boat 6. A cassette receiving mechanism 17 and a clean air blowing means 18 are disposed in the input/output chamber 13. The cassette receiving mechanism 17 receives a cassette C from a cassette accommodating vessel. The clean air blowing means 18 forces a side flow of clean air into the cassette C.

As shown in FIG. 2, the loading chamber 8 is integrally connected to the holding member accommodating chamber 16. A side wall that partitions the chambers 8 and 16 is provided with clean air delivery openings 20 and 20 that have respective filters 19 and 19. The opposed side wall is provided with air exhaust openings 22 and 22 that have respective filters 21 and 21. Both the chambers 8 and 16 are kept at nearly normal pressure so that a side flow of clean air with a high cleanliness level (for example class 1) is produced. Part of air executed from the air exhaust openings 22 and 22 is returned to the air delivery openings 20 and 20 and then circulated in these chambers 8 and 16.

As shown in FIG. 3, a holding table 24 is disposed below the holding member accommodating chamber 16 through a bellows seal 23. The holding table 24 is vertically moved. A detecting means 25 is disposed on the holding table 24 at a position outside the holding member accommodating chamber 16. The detecting means 25 determines whether or not the wafer boat 6 is present on the holding table 24. The detecting means 25 comprises a movable detecting member 25A and a light sensor 25D. The movable detecting member 25A is connected to the holding table 24. The light sensor 25D is constructed of a light emitting portion 25B and a light receiving portion 25C. The light emitting portion 25B is opposed to a vertical moving portion of the movable detecting member 25A. Thus, when the wafer boat 6 is accommodated in the holding member accommodating chamber 16 and the wafer boat 6 is placed on the holding table 24, the holding table 24 lowers due to its weight against an elastic force of the bellows seal 23. The movable detecting member 25A lowers corresponding to the holding table 24. Thus, the movable detecting member 25A blocks a light beam, which is emitted from the light emitting portion 25B to the light receiving portion 25C. Consequently, the detecting means 25 detects the presence of the wafer boat 6. It should be appreciated that the present invention is not limited to such a construction. Instead of the detecting means 25, another detecting means may be used to detect the presence of the wafer boat 6. For example, a sensor may be buried in a ceiling portion, a floor portion, or a wall portion of the holding member accommodating chamber 16 through a seal mechanism so as to detect the presence of the wafer boat 6. On the other hand, when the wafer boat 6 is raised from the holding table 24, it rises due to the elastic force of the bellows seal 23.

As shown in FIG. 1, a wafer transfer 50 is disposed adjacent to the input/output chamber 13 in the holding member accommodating chamber 16. The wafer transfer 50 is supportably moved by a transfer elevator 51. While the wafer transfer 50 is rising or lowering, it extracts one of the wafers W contained in the carrier C placed on the transfer stage 48 in the input/output chamber 13 at a time and places the wafers W on the wafer boat 6 accommodated in the holding member accommodating chamber 16. Alternatively, the wafer transfer 50 returns the treated wafers W to the carrier C placed on the transfer stage 48.

The process tube 1, which constructs the treatment chamber, is formed of an invert-U-letter shaped, upright type cylindrical quartz vessel. A heater 5 is disposed on an outer periphery of the process tube 1. A cylindrical manifold 2 is connected to a lower end portion of the opening of the process tube 1. The manifold 2 has an upper flange and a lower flange. As shown in FIG. 1, a gas delivery pipe 4 and a gas exhaust pipe 3 are connected to a peripheral wall portion of the manifold 2. The gas delivery pipe 4 delivers a predetermined treatment gas to the process tube 1. The gas exhaust pipe 3 exhausts waste gas from the process tube 1. The gas delivery pipe 4 is connected to a treatment gas supply source and a clean air supply source (that are not shown) through a gas switch valve (not shown) so as to alternately supply the treatment gas and the clean air to the process tube 1.

The loading chamber 8 is airtightly constructed in such a way that the entire outer periphery of the loading chamber 8 (that is made of for example stainless steel panels) is welded or the loading chamber 8 is sealed by O-ring seals. A clean air delivery pipe 27 is connected to upper and lower portions of the loading chamber 8. The clean air delivery pipe 27 is also connected to for example a clean air supply source (not shown). The transfer mechanism 12 disposed in the loading chamber 8 comprises a boat elevator 7 and a ball screw unit 7A. The boat elevator 7 holds the wafer boat 6. The ball screw unit 7A vertically moves the ball elevator 7. Since the inside of the loading chamber 8 is not necessarily in a vacuum condition, wall panels of the loading chamber 8 do not need to have a high rigidity. It should be appreciated that the ball screw unit 7A of the transfer mechanism 12 may be secured to a wall of the loading chamber 8. A conveying mechanism 28 is disposed adjacent to the holding member accommodating chamber in the loading chamber 8. The conveying mechanism 28 transfers the wafer boat 6 between the boat elevator 7 of the transfer mechanism 12 and the holding member accommodating chamber 16. The conveying mechanism 28 is connected to a drive portion 28A and a multi-articulated arm 28B. The drive shaft 28A is disposed outside the loading chamber 8. The drive shaft 28A horizontally rotates and rises and lowers the multi-articulated arm 28B. The multi-articulated arm 28B is connected to a transmission shaft of the drive portion 28A disposed in the loading chamber 8. The multi-articulated arm 28B holds the wafer boat 6. A furnace opening portion is formed at an upper portion of the loading chamber 8. The furnace opening portion has an auto shutter 29 that opens and closes an opening portion that connects the loading chamber 8 and the process tube 1.

The input/output chamber 13 is disposed in the atmosphere of clean air with a high cleanliness level (for example class 1). The input/output chamber 13 has the cassette accommodating vessel port 14, at which the cassette accommodating vessel 30 is placed. The cassette accommodating vessel 30 accommodates the wafer carrier C, which contains a plurality of (for example, 25) wafers. As described above, the input/output chamber 13 has the cassette receiving mechanism 17 and the clean air blowing means 18. The cassette receiving mechanism 17 receives the cassette C from the cassette accommodating vessel 30. The clean air blowing means 18 blows a side flow of clean air into the cassette C. In the example shown in FIG. 1, there are two cassette accommodating vessel ports 14 disposed at a left position and a right position of the input/output chamber 13.

Next, the cassette accommodating vessel 30 will be described. As shown in FIG. 5, the cassette accommodating vessel 30, which is disclosed in Japanese Patent Laid-Open Publication No. 1-222429 and U.S. Pat. No. 4534389, comprises a vessel main body 31 and a vessel bottom portion 32. The vessel main body 31 is open-bottomed and has a space for accommodating one cassette C. The vessel bottom portion 32 closes the open portion of the vessel main body 31. The cassette C is accommodated in the cassette accommodating vessel 30 in such a way that it is positively pressed with clean air or inert gas with a high cleanliness level. A gas delivery passageway (not shown) that delivers the clean air or the inert gas to the cassette accommodating vessel 30 is formed on the vessel bottom portion 32. The gas delivery passageway has a valve.

The vessel bottom portion 32 is airtightly disposed on a flange portion 31A at a lower portion of the vessel main body 31 through a seal member 33 such as an O ring. Lock pins 34 that are protrusible and contractible are disposed at predetermined peripheral positions of the vessel bottom portion 32. The lock pins 34 are connected to a rotating link mechanism 35 disposed at a center portion of the vessel bottom portion 32. Thus, when the rotating link mechanism 35 is rotated, the vessel bottom portion 32 is connected to the vessel main body 31. As an example of the cassette accommodating vessel 30, SMIF-POD (Trade Mark) may be used.

As shown in FIGS. 1 and 4, the cassette accommodating vessel port 14 is formed of a cavity of the front wall of the input/output chamber 13. As shown in FIG. 5, a boat holding table 36, on which the vessel main body 31 is placed, has a cassette inlet hole 37 that is larger than the inner diameter of the flange portion 31A of the vessel main body 31 and smaller than the outer diameter thereof. A vessel bottom portion holding table 38 is disposed at the cassette inlet hole 37. The vessel bottom portion holding table 38 has a peripheral portion with a downward inclination so as to go down from the boat holding table 36. The vessel bottom portion holding table 38 constructs a part of the cassette receiving mechanism 17. A rotating pin 39 is disposed at a center portion of the table 38. The rotating pin 39 fits to the rotating link mechanism 35 of the vessel bottom portion 32. When the table 38 is rotated, the rotating link mechanism 35 works, thereby protruding the lock pins 34.

As shown in FIG. 1, the vessel bottom portion holding table 38 is disposed at a forward end of a vertical moving arm 41. The vertical moving arm 41 is vertically moved by a ball screw 40. The vessel main body 31 is not moved, whereas the vessel bottom portion 32 and the cassette C disposed thereon are lowered. Thus, the cassette C is transferred to the input/output chamber 13. In such a way, the cassette receiving mechanism 17 is constructed.

A horizontal moving arm 42 that is a multi-articulated arm is disposed on the ball screw 40. The horizontal moving arm 42 is horizontally moved from a lower position of the vessel bottom portion holding table 38. An arm auxiliary member 42A is disposed at a forward end of the horizontal moving arm 42. The arm auxiliary member 42A swings so that it is always kept horizontal. Nail portions 43 are disposed at both edges of the arm auxiliary member 42A. When the nail portions 43 are closed, while the horizontal moving arm 42 is being bent, an upper side wall of the cassette C is held by the nail portions 43.

A handle portion 44 is disposed at an upper portion of the vessel main body 31 of the cassette accommodating vessel. For example, the operator can hold the handle portion 44 to carry the entire cassette accommodating vessel.

A plurality of key-shaped vessel holders 45 are disposed on the boat holding table 36 at peripheral positions of the cassette inlet hole 37. When the key-shaped vessel holders 45 are raised and lowered, the flange portion 31A of the cassette accommodating vessel 31 is locked and unlocked, respectively.

As shown in FIG. 1, a carrier transfer 46 is disposed just behind the cassette accommodating vessel port 14 in the input/output chamber 13. The carrier transfer 46 is raised and lowered by an elevator 47. A transfer stage 48 is disposed behind the carrier transfer 46. A shelf-shaped carrier stock stage 49 is disposed at an upper side position of the transfer stage 48. The carrier stock stage 49 is constructed of a plurality of shelves that have two rows and four levels. The carrier stock stage 49 can store the wafers carriers C without changing their orientation. The carrier stock stage 49 can also store empty carriers C where wafers have been removed.

As shown in FIGS. 7A and 7B, a reflection type laser beam sensor (wafer counter) 53 is disposed at a forward end of each of the carrier transfers 46. The laser beam sensor 53 is constructed of a light emitting device 52A and a light receiving device 52B that are aligned on nearly the same plane. When the carrier transfer 46 is raised or lowered, the laser beam sensor 53 detects reflection beams reflected from edge portions of wafers, thereby obtaining information about the number of wafers and positions thereof. This information is used when the wafer transfer 46 transfers wafers. FIG. 7B is a view taken along lines B—B of FIG. 7A. The input/output chamber 13, the loading chamber 8, the holding member accommodating chamber 16, and the process tube 1 are partitioned by a partition wall 54 except for a portion where the transfer stage 48 operates. An air delivery HEPA filter 55 is disposed between the partition wall 54 and the carrier stock stage 49. An air delivery opening 56 is disposed at an upper portion of the air delivery HEPA filter 55. The air delivery opening 56 delivers clean air with a high cleanliness level (for example class 1) to the input/output chamber 13. The delivered clean air horizontally flows from a side surface to the input/output chamber 13 (see FIG. 8).

An inner HEPA filter 57 is disposed at an upper portion of the cassette accommodating vessel port 14. The inner HEPA filter 57 is opposed to the air delivery HEPA filter 55. The inner HEPA filter 57 has a blowing opening 57A that faces downward. Thus, the inner HEPA filter 57 downwardly bends the flow of the clean air filtered by the air delivery HEPA filter, thereby creating a circulation flow or a down flow. The blowing opening 57A should be as wide and large as possible as long as it does not interfere with the carrier transfer 46.

As shown in FIG. 8, an air exhaust opening 58 is disposed at a lower position on the side wall of the input/output chamber 13. The air exhaust opening 58 has a air blow fan 59 that receives circulation flow or the down flow of waste air. An air exhaust duct 60 is connected to the air exhaust opening 58 along a vertical corner portion of the input/output chamber 13. The air exhaust duct 60 exhausts the atmosphere in the input/output chamber 13 to the outside of the treatment apparatus. Part of the waste air may be returned to the input/output chamber 13 rather than being directly exhausted to the outside of the treatment apparatus. FIG. 8 is an exploded perspective view showing an air ventilation system of the input/output chamber.

As shown in FIGS. 1, 9, and 10, a side flow blowing header 62 is disposed on a side wall 61 that partitions a lower portion of the cassette accommodating vessel port 14, which is formed in a stage shape. The side flow blowing header 62 constructs a part of the clean air blowing means 18. A blowing opening 63 is formed at a lower portion of the cassette accommodation vessel port 14, where the cassette C is lowered and received in the input/output chamber. The blowing opening 63 has a large number of blades 64 that are aligned in the horizontal direction toward the cassette C. Thus, the blowing opening 63 blows a side flow 65 of clean air into the cassette C. The blades 64 may be bent in oblique direction.

The size of the side flow blowing header 62 is nearly the same as the size of the side wall 61, which partitions the lower portion of the boat 14, so as to prevent the atmosphere from staying at a lower position.

As a clean air supply means, a clean air passageway 66 is disposed. The clean air passageway 66 connects an upper portion of the side flow blowing header 62 and the blowing opening 57A of the inner HEPA filter 57. A funnel-shaped air delivery portion 67 is disposed at a side edge portion of the blowing opening 57A of the clean air passageway 66 so as to receive a desired amount of clean air.

A distributing passageway 68 is disposed at an upper portion of the side flow blowing header 62. The distributing passageway 68 equally distributes clean air supplied from the clean air passageway 66 in a width direction of the side flow blowing header 62.

The distributing passageway 68 may be a pipe member that has a large number of air ventilation holes. The clean air supply method is not limited to the above-described method, where air supplied from the inner HEPA filter 57 is used. Instead, a clean air supply pipe (not shown) disposed adjacent to the treatment apparatus may be directly connected to the side flow blowing header 62. In addition, to keep the cleanliness level of clean air high, a HEPA filter may be disposed in the side flow blowing header 62.

Next, operations of the above-described treatment apparatus will be described.

First, an operation for transferring wafers accommodated in the input/output chamber 13 to the process tube 1 through the loading chamber 8 will be descried.

The wafer boat 6 is accommodated in the holding member accommodating chamber 16. The wafer carrier C contains a predetermined number of wafers W. The wafer carrier C is transferred to the wafer boat 6 disposed in the holding member accommodating chamber 16 by the wafer transfer 50. Next, the conveying mechanism 28 is driven so that the wafer boat 6 is moved to and placed on the boat elevator 7.

The boat elevator 7 is raised and the wafer boat 6 is loaded into the process tube 1. The flange 6A of the wafer boat 6 is brought into contact with the flange 2A. Thus, the process tube 1 is airtightly closed. The atmospheric gas in the process tube 1 is exhausted by the exhaust pipe 3. When the inside of the process tube 1 becomes a vacuum, a treatment gas is delivered from the gas delivery pipe 4 to the process tube 1 so as to perform a desired treatment.

After the treatment is completed, the treatment gas in the process tube 1 is exhausted. When the inside of the process tube 1 becomes a predetermined vacuum, clean air is delivered from the gas delivery pipe 4 to the process tube 1. When the pressure of the clean air becomes nearly equal to the pressure of the clean air in the loading chamber 8, namely the same pressure as the atmosphere, the wafer boat 6 is lowered. In the reverse order of the wafer loading sequence, the treated wafers W are unloaded.

Clean air with a high cleanliness level, for example class 1, is always delivered to the loading chamber 8 and the holding member accommodating chamber 16 through the filters 19 and 19. The side flow is produced and a part thereof is circulated so that the loading chamber 8 and the holding member accommodating chamber 16 are kept at nearly the atmospheric pressure. In this case, the air pressures in the loading chamber 8 and the holding member accommodating chamber 16 are preferably slightly higher than the air pressure in the output/input chamber 13. Thus, the loading chamber 8 and the holding member accommodating chamber 16 are positively pressured. Consequently, the atmosphere in the loading chamber 8 and the holding member accommodating chamber 16 flows to the input/output chamber 13 through the transfer stage 48, thereby purging particles (see FIG. 2).

Next, an operation for transferring wafers W between the cassette accommodating vessel 30 and the input/output chamber 13 will be described.

The cassette C, which contains for example 25 wafers W that have been treated in the preceding step or not treated, is accommodated in the cassette accommodating vessel 30. The cassette accommodating vessel 30 is placed on the vessel bottom portion holding table 38, which is a predetermined position of the boat holding table 36 of the cassette accommodating vessel port 14, by the AGV or the operator. At this point, the vessel holder 45 of the boat holding table 36 is raised so as to secure the flange portion 31A of the vessel main body.

At this point, the vessel bottom portion holding table 38 disposed at the forward end of the vertical moving arm 41 of the cassette receiving mechanism 17 airtightly closes the cassette inlet hole 37, which is formed on the boat holding table 36, so as to prevent the atmosphere in the working region with a low cleanliness level from entering the input/output chamber 13. The cassette accommodating vessel 30 is filled with clean air with a very high cleanliness level or an inert gas such as N2 gas so as to create the non-oxygen atmosphere. The clean air or inert are is positively pressured so as to prevent the atmosphere in the other chambers from entering the cassette accommodating vessel 30. Thus, even if the cassette C is conveyed through a working region in a low cleanliness level such as class 1000, the wafers W are not exposed to the atmosphere. In this embodiment, the cassette accommodating vessel 30 is filled with clean air with a high cleanliness level.

After the vessel main body 31 is secured to the boat holding table 36, the rotating pin 39 on the vessel bottom portion holding table 38 is rotated, thereby removing the lock pins, which connect the vessel bottom portion 32 and the flange portion 31A.

Next, the vertical moving arm 41 is lowered. Thus, the cassette C placed on the vessel bottom portion 32 is entered into the input/output chamber 13. The vessel bottom portion holding table 38 is lowered and thereby the cassette inlet hole 37 of the boat holding table 36 is opened. Since the vessel main body 31 of the cassette accommodating vessel is airtightly closed, the atmosphere in a low cleanliness level does not enter the input/output chamber 13.

After the cassette C has been received, the horizontal moving arm 42 is bent. The nail portions 43 of the horizontal moving arm 42 are placed above the cassette C. The nail portions 43 are closed so as to hold the upper side portions of the cassette C. While the cassette C is being held, the horizontal moving arm 42 is extended. Thus, the cassette C is moved in horizontal direction. The cassette C is transferred to the carrier transfer 46, which is vertically moved, by the elevator 47. When the wafers W are conveyed from the carrier transfer 46 to the outside, the above-described operation is performed in the reverse order.

Just before the carrier C is transferred to the carrier transfer 46 by the horizontal moving arm 42, a laser beam is irradiated from the light emitting device 52A of the laser beam sensor 53 (see FIG. 7), which is a wafer counter and disposed at the forward end of the carrier transfer 46, which is raised or lowered along a side of the carrier C. When the light receiving device 52B receives the reflected light beam reflected from the edge surfaces of the wafers, the information about the number of wafers and positions thereof is obtained. The wafer transfer 46 transfers the wafer boat 6 corresponding to the obtained information.

The cassette, after the information about the number of wafers and positions thereof has been detected, is transferred to the carrier transfer 46 that will be raised or lowered.

When the carrier C transferred to the carrier transfer 46 is queued for the treatment, the carrier C is temporarily placed on the carrier stock stage 49. Alternatively, when the transfer stage 48 is empty, the carrier C is placed on the transfer stage 48. One or a plurality of the wafers W are extracted from the carrier C placed on the carrier stage 48 at a time and transferred to the wafer boat 6.

The cassette C, which is empty, is held by the wafer transfer 50 and accommodated in the carrier stock station 49 until the treatment for the wafers W is completed.

The cassette accommodating vessel 30, which is airtightly sealed from the outer atmosphere, is placed on the cassette accommodating vessel port 14 so as to input and output the wafers W. Thus, it is not required to remarkably improve the cleanliness level of the working region S, where the operator or the like works, in comparison with the conventional apparatus, where wafers are exposed to the atmosphere while they are being conveyed. In the conventional apparatus, the cleanliness level of the working region S should be kept to class 1 so as to prevent particles from adhering to the wafers W. However, according to this embodiment, the cleanliness level of the atmosphere in only the cassette accommodating chamber 30, the loading chamber 8, and the holding member accommodating chamber 16 should be keep at the class 1. The cleanliness level of the atmosphere in the working region S can be lower than the cleanliness level of the atmosphere in these chambers. For example, the cleanliness level of the atmosphere in the working region S may be the class 1000. Thus, the cleanliness level of the atmosphere in the working region S can be lowered, thereby reducing the construction cost and the operation cost of the clean room. Consequently, the fabrication cost of the wafers can be remarkably reduced.

In this case, the pressure applied to the inside of the cassette accommodating vessel 30 is higher than the air pressure in the input/output chamber, the atmosphere in a low cleanliness level does not enter the cassette accommodating vessel 30.

As shown in FIG. 8, clean air delivered from an upper portion of the input/output chamber 13 is circulated therein through the air delivery HEPA filter 55. Thus, the circulation flow or a down flow is produced.

In other words, clean air is filtered by the air delivery HEPA filter 55 and delivered from the blowing opening in horizontal direction. The air is filtered by the inner HEPA filter 57 and delivered from the blowing opening 57A in downward direction. Thus, the down flow 69 is produced.

The waste air at the bottom of the input/output chamber 13 is exhausted to the outside of the treatment apparatus through the air exhaust opening 58 and the exhaust duct 60. Part of exhausted air is returned to the input/output chamber 13 and recirculated therein.

The part of clean air filtered by the inner HEPA filer 57 is supplied to the side flow blowing header 62 of the clean air blowing means 18 through the clean air passageway 66. The clean air is horizontally delivered from the side flow blowing header 62. Thus, the side flow 65 is created below the cassette accommodating vessel port 14.

As shown in FIGS. 9 and 10, a large number of wafers W are horizontally aligned at predetermined pitches in the cassette C. Thus, when the cassette is lowered and placed in the input/output chamber 13, since the wafers W are exposed to the side flow 65, particles that adhere to the wafers are blown and purged.

Since the cassette accommodating vessel port 14 is formed in a stage shape, the space below the cassette accommodating vessel port 14 is not exposed to the down flow 69. Thus, air tends to stay in this space. However, the side flow 65 of clean air delivered from the side flow blowing header 62 prevents the air from staying in this space. The side flow 65 can effectively purge particles and the like that take place in a movable mechanism such as the cassette receiving mechanism 17, which is constructed of the ball screw 40 and the vertical moving arm 41. Thus, the decrease of the yield of the final products can be prevented.

The side flow 65 of the air containing the particles and the like is downwardly exhausted to the outside of the treatment apparatus by the down flow 69.

The empty cassette accommodating vessel 30 may be temporarily accommodated in a holding shelf (not shown) that is disposed in a working region S upstream of the treatment apparatus by the operator. In this case, the vessel bottom portion holding table 38 of the cassette receiving mechanism 17 should be raised so as to airtightly close the cassette inlet hole 37.

It should be appreciated that the construction of the cassette accommodating vessel according to the first embodiment of the present invention is not limited to the above-described construction. Instead, any construction may be used as long as the cassette accommodating vessel can airtightly accommodate the cassette. In addition, the constructions of the vertical moving arm 41 and the horizontal moving arm 42 of the cassette receiving mechanism 17, which transfer the carrier C to and from the cassette accommodating vessel are not limited to the above-described constructions as long as the cassette C can be transferred.

In the above-described embodiment, the treatment apparatus is provided with the holding member accommodating chamber 16 so as to reduce the consumption of inert gas and operating time of the treatment apparatus. However, the first embodiment may be applied to the conventional treatment apparatus, which is not provided with the holding member accommodating chamber 16. In addition, the transfer stage 48 and the boat elevator 7 may be adjacently disposed so that the transfer elevator 51 directly transfers the wafers W contained in the cassette C on the transfer stage to the wafer boat 6 on the boat elevator 7.

In the above-described embodiment, the construction of the holding member accommodating chamber 16 of the input/output chamber 13 and the construction of the loading chamber 8 are the same as the conventional constructions, where the atmospheric air therein is always kept at nearly the air pressure by clean air. However, it should be appreciated that the first embodiment of the present invention is not limited to such constructions. Instead, the loading chamber 8 may be airtightly closed against the input/output chamber 13 (this construction is referred to as load lock chamber construction). In addition, a construction where inert gas such as N2 or clean air is supplied for a positive pressure, exhausted, and deaerated for a vacuum may be used.

When the cassette accommodating vessel is filled with an inert gas such as N2, the input/output chamber and the loading chamber are preferably filled with the inert gas as the atmospheric gas so as to suppress natural oxide films from being formed on the wafer surfaces.

The first embodiment of the present invention may be applied to treatment apparatuses for glass substrates, LCD substrate, and so forth as well as upright type CVD apparatuses and oxide diffusion apparatuses.

As was described above, according to the treatment apparatus of the first embodiment, the following excellent effects can be obtained.

The workpieces are contained in the cassette. The cassette is accommodated in the cassette accommodating vessel. The cassette accommodating vessel is placed on the cassette accommodating vessel port. The cassette accommodating vessel port is input and output to and from the input/output chamber. Thus, the workpieces are not exposed to atmosphere in the working region. Consequently, it is not required to remarkably improve the cleanliness level of the working region outside the treatment apparatus in comparison with the cleanliness level of the atmospheric air in the input/output chamber.

Thus, it is required to improve the cleanliness level of the atmosphere only in the input/output chamber and the loading chamber, where the workpieces are exposed to the atmosphere. In other words, since the cleanliness level of the working region in the clean room can be lowered, the construction cost of the clean room and the running cost thereof can be remarkably reduced.

In addition, the clean air blowing means is disposed below the cassette accommodating vessel port so as to create the side flow of the clean air. Thus, particles can be purged from the surface of the workpieces. Alternatively, the atmosphere at the bottom of the port can be circulated so as to prevent the air from staying. Thus, the yield of the final products can be improved.

Second Embodiment

Next, with reference to FIGS. 11 to 18, a second embodiment of the present invention will be described.

In this embodiment, the present invention is applied to a heat treatment apparatus for semiconductor wafers.

Figure 11:
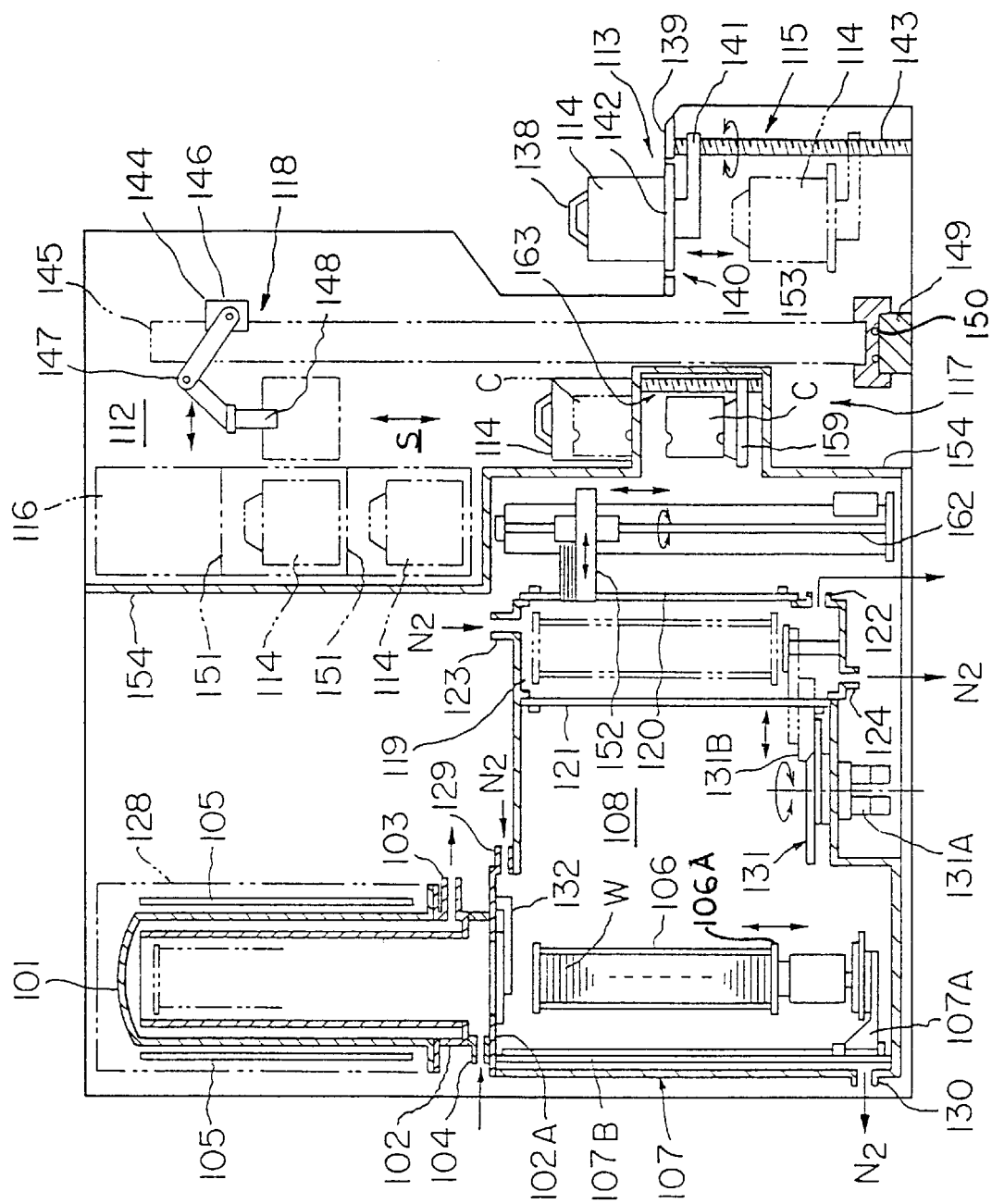
FIG. 11 is a schematic sectional view showing a treatment apparatus according to a second embodiment of the present invention.
Figure 12:
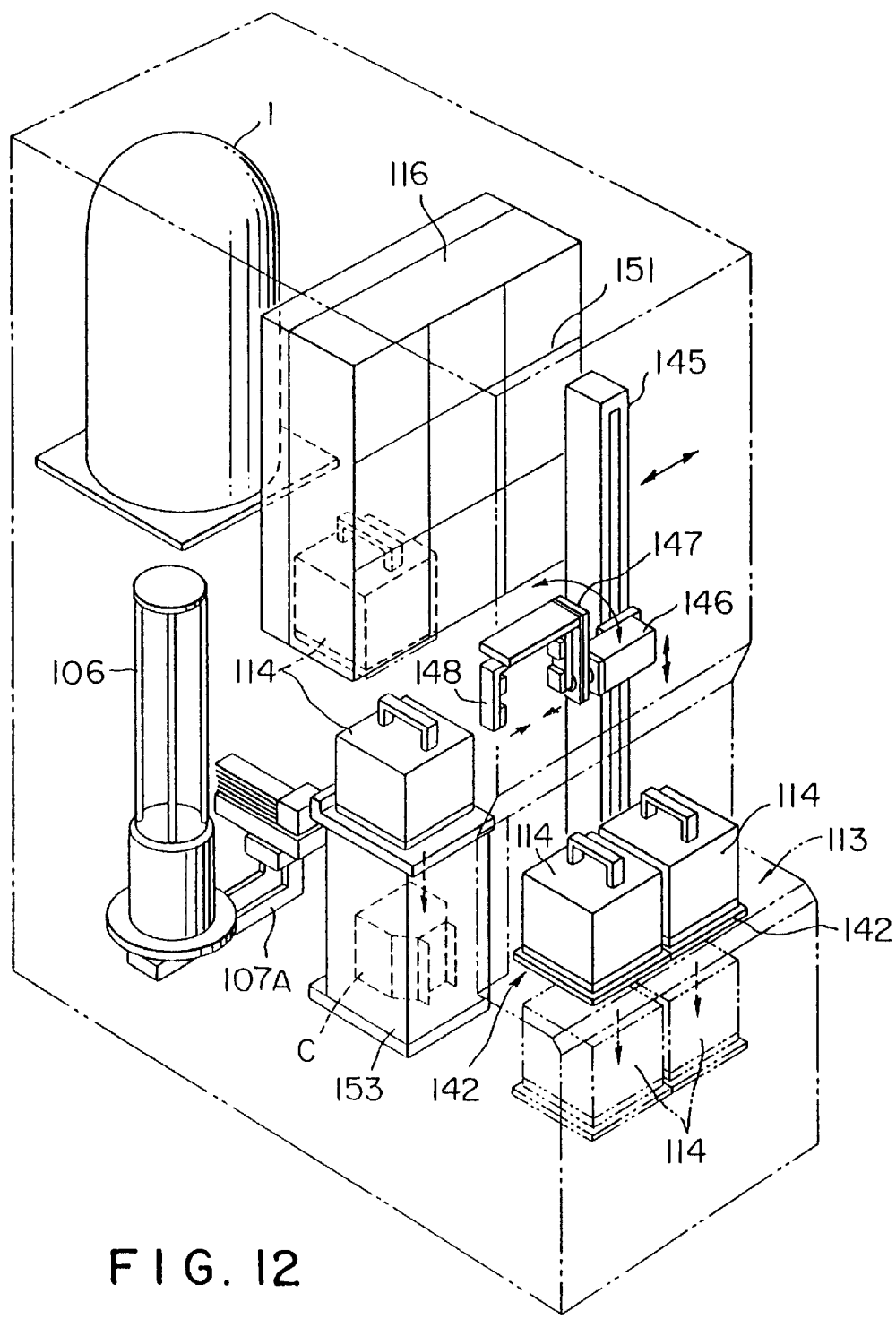
FIG. 12 is a perspective view showing the front of the treatment apparatus of FIG. 11.
Figure 13:
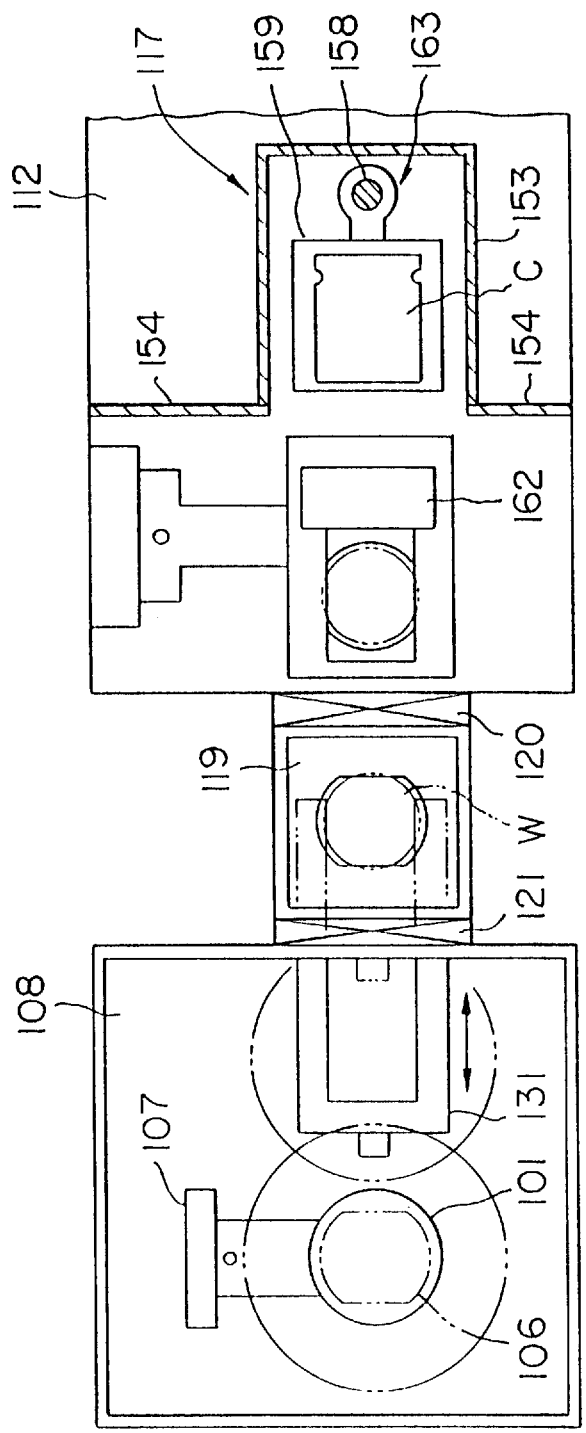
FIG. 13 is a schematic plan view showing the treatment apparatus.
Figure 14:
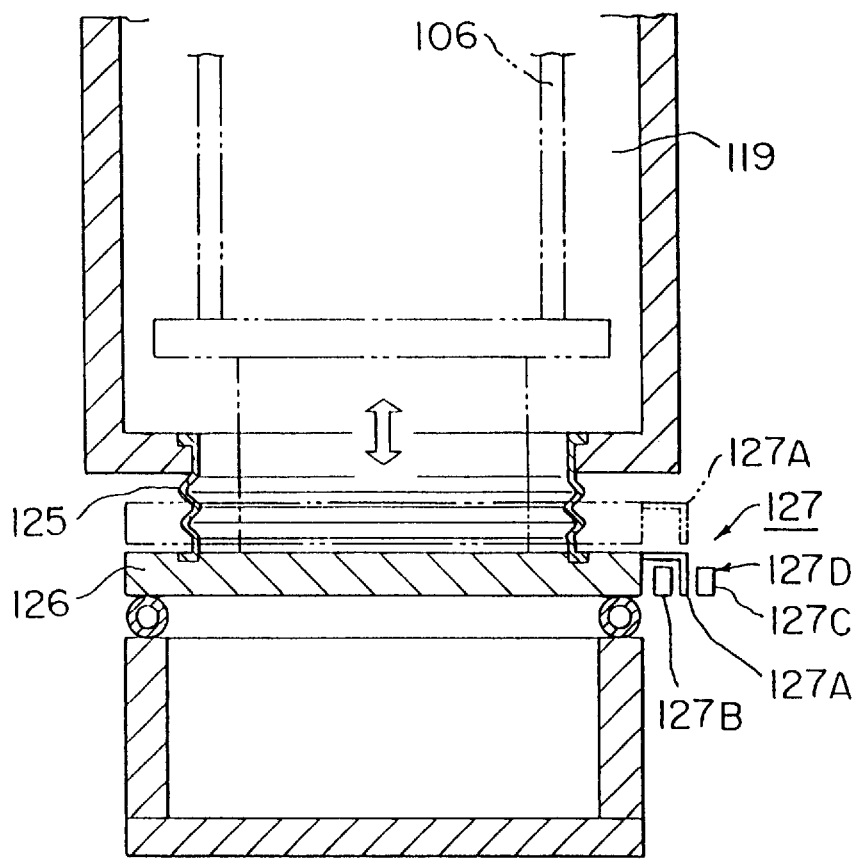
FIG. 14 is a sectional view showing a holding member accommodating chamber according to the second embodiment of the present invention.
Figure 15:
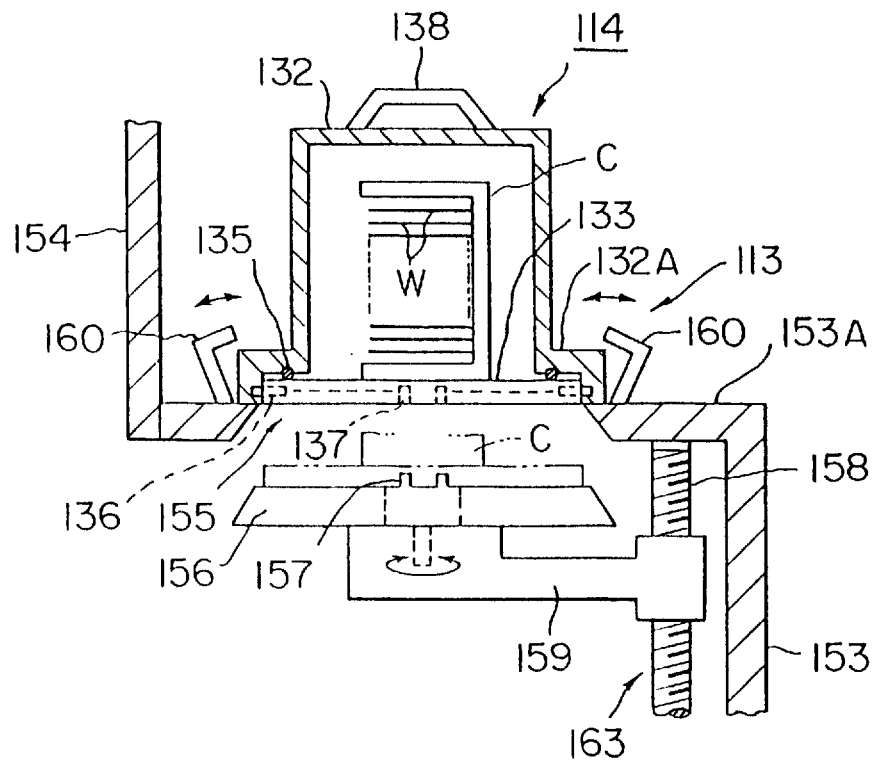
FIG. 15 is a sectional view showing a cassette extracting stage.
Figure 16:
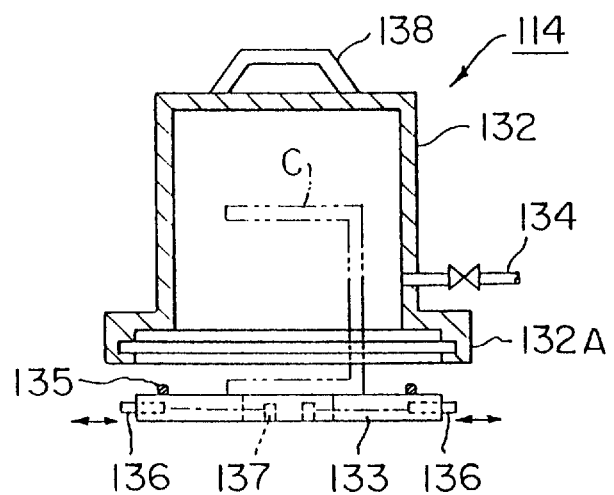
FIG. 16 is a sectional view showing a construction of a cassette accommodating vessel.

FIG. 11 is a schematic sectional view showing a treatment apparatus according to a second embodiment of the present invention; FIG. 12 is a perspective view showing the front of the treatment apparatus of FIG. 11; FIG. 13 is a schematic plan view showing the treatment apparatus; FIG. 14 is a sectional view showing a holding member accommodating chamber according to the second embodiment of the present invention; FIG. 15 is a sectional view showing a cassette extracting stage; and FIG. 16 is a sectional view showing a construction of a cassette accommodating vessel. In this embodiment, a loading room of the treatment apparatus is constructed of a load lock chamber that is airtightly sealed from other chambers and filled with an inert gas such as N2 gas that can be delivered and deaerated.

The treatment apparatus according to the second embodiment comprises a process tube 101, a load lock chamber 108, an input/output chamber 112, a cassette accommodating vessel port 113, a receiving means 115, a vessel storage stage 116, a cassette extracting stage 117, vessel transfer means 118, and a holding member accommodating chamber 119. The process tube 101 is a treatment chamber that performs a predetermined treatment for wafers W, which are workpieces. The load lock chamber 108 serves as a loading chamber and has a transfer mechanism 107. The transfer mechanism 107 transfers a wafer boat 106 to and from the process tube 101. The wafer boat 106 serves as a holding member that contains a large number of (for example 100) wafers W. The input/output chamber 112 inputs and outputs the wafers W to and from the load lock chamber 108. The cassette accommodating vessel port 113 is formed at the input/output chamber 112. The receiving means 115 receives the cassette accommodating vessel 114 placed on the cassette accommodating vessel port 113 into the input/output chamber 112. The vessel storage stage 116 temporarily stores the cassette accommodating vessel 114. The cassette extracting stage 117 extracts the cassette C from the cassette accommodating vessel 114. The vessel transfer means 118 transfers the cassette accommodating vessel 114 in the input/output chamber 112. The holding member accommodating chamber 119 is disposed between the load lock chamber 108 and the input/output chamber 112. The holding member accommodating chamber 119 accommodates the wafer boat 106.

A front auto door 120 is disposed between the holding member accommodating chamber 119 and the input/output chamber 112. A rear auto door 121 is disposed between the holding member accommodating chamber 119 and the load lock chamber 108. If necessary, the front auto door 120 and the rear auto door 121 are opened. When the front auto door 120 and the rear auto door 121 are closed, the holding member accommodating chamber 119 is sealed from other chambers. A vacuum pipe 122 is connected to the holding member accommodating chamber 119. The vacuum pipe 122 is connected to a vacuum pump (not shown). In addition, a $N_2$ gas delivery pipe 123 and a $N_2$ gas exhaust pipe 124 are connected to the holding member accommodating chamber 119. The $N_2$ gas delivery pipe 123 is connected to for example a $N_2$ gas supply source (not shown). Thus, the atmosphere in the holding member accommodating chamber 119 can be substituted with the atmosphere of a predetermined vacuum or $N_2$ gas.

As shown in FIG. 14, a holding table 126 is disposed at a lower position of the holding member accommodating chamber 119. The holding table 126 is vertically moved through for example a bellows seal 125. A detecting means 127 is disposed at an outer position of the holding table 126. The detecting means 127 determines whether or not the wafer boat 106 is present. The detecting means 127 comprises a movable detecting member 127A and a light sensor 127D. The movable detecting member 127A is connected to the holding table 126. The light sensor 127D is constructed of a light emitting portion 127B and a light receiving portion 127C. The light emitting portion 127B is opposed to a vertical moving portion of the movable detecting member 127A. When the wafer boat 106 is accommodated in the holding member accommodating chamber 119 and the wafer boat 106 is placed on the holding table 126, the holding table 126 lowers due to the weight thereof against an elastic force of the bellows seal 125. In addition, the movable detecting member 127A also lowers, thereby preventing the light beam emitted by the light emitting portion from entering the light receiving portion 127C. Thus, the detecting means 127 can determine whether or not the wafer boat 106 is present. It should be appreciated that the detecting means 106 is not limited to such a construction. Instead, any detecting means may be used. For example, the presence of the wafer boat 106 may be determined by a sensor buried in a ceiling portion, a floor portion, or a wall portion of the holding member accommodating chamber 119 through a seal mechanism.

The process tube 101, which constructs the treatment chamber, is formed of an inverse-U-letter shaped, upright type cylindrical quartz vessel. A heater 105 is disposed on an outer periphery of the process tube 101. A protection cover 128 is disposed around the heater 105. The protection cover 128 contains a cooling pipe and a heat insulating material. A manifold 102 is disposed at an lower end of an opening of the process tube 101. The manifold 102 is cylindrically shaped and has an upper flange and a lower flange. As shown in FIG. 11, a gas delivery pipe 104 and a gas exhaust pipe 103 are connected to a peripheral wall portion of the manifold 102. The gas delivery pipe 104 delivers a predetermined treatment gas to the process tube 101. The gas exhaust pipe 103 exhausts waste gas from the process tube 101. The gas delivery pipe 104 is connected to a predetermined treatment gas supply source and an $N_2$ gas supply source through a gas switch valve (not shown). Thus, the treatment gas and the $N_2$ gas can be alternately delivered to the process tube 101.

The load lock chamber 108 is sealed by welding the entire periphery of for example stainless steel panels. Alternatively, the load lock chamber 108 is sealed by an O ring. A $N_2$ gas delivery pipe 129 and a $N_2$ gas exhaust pipe 130 are connected to an upper portion and a lower portion of the load lock chamber 108, respectively. The $N_2$ gas delivery pipe 129 is connected to for example a $N_2$ gas supply source (not shown). Thus, a predetermined amount of $N_2$ gas is always supplied to the load lock chamber 108. The transfer mechanism 107, which is disposed in the load lock chamber 108, comprises a boat elevator 107A and a ball screw unit 107B. The boat elevator 107A holds the wafer boat 106. The ball screw unit 107B vertical moves the boat elevator 107A. A conveying mechanism 131 is disposed in the load lock chamber 108 adjacent to the holding member accommodating chamber 119. The conveying mechanism 131 conveys the wafer boat 106 between the boat elevator 107A of the transfer mechanism 107 and the holding member accommodating chamber 119. The conveying mechanism 131 comprises a drive portion 131A and a multi-articulated arm 131B. The drive portion 131A is disposed outside the load lock chamber 108 and drives a horizontal rotation (swing motion) and vertical motion. The multi-articulated arm 131B is disposed in the load lock chamber 108 and connected to a transmission shaft of the drive portion 131A. The multi-articulated arm 131B holds the wafer boat 106. A furnace opening portion is formed at an upper portion of the load lock camber 108. An auto shutter 132 is disposed at the furnace opening portion. The auto shutter 132 opens and closes an opening portion that connects the load lock chamber 108 and the process tube 101.

As shown in FIG. 11 (right side), two cassette accommodating vessel ports 113 are disposed on left and right positions at the front of the input/output chamber 112. As described above, each of the cassette accommodating vessel ports 113 holds the cassette accommodating vessel 114. The cassette accommodating vessel 114 accommodates the carrier C, which contains a plurality of (for example, 25) wafers W (see FIG. 12).

Next, the cassette accommodating vessel 114 will be described. The cassette accommodating vessel 114 is disclosed in Japanese Patent Laid-Open Publication No. 1-222429 and U.S. Pat. No. 4534389. As shown in FIG. 16, the cassette accommodating vessel 114 comprises a square vessel main body 132 and a vessel bottom portion 133. The vessel main body 132 has a size for accommodating the cassette C. The vessel main body 132 is open-bottomed. The vessel bottom portion 133 airtightly closes the opening portion. When the cassette C is accommodated in the cassette accommodating vessel 114, it is filled with clean air with a high cleanliness level or an inert gas such as $N_2$. Thus, the inside of the cassette accommodating vessel 114 is positively pressured. A gas delivery passageway 134 with a valve is disposed at a bottom portion or a side wall of the cassette accommodating vessel 114. The gas delivery passageway 134 delivers the clean air and the inert gas to the cassette accommodating vessel 114.

The vessel bottom portion 133 is airtightly disposed at a flange portion 132A that is disposed at a lower portion of the vessel main body 132 through a seal member 135 such as an O ring. Lock pins 136 are protrusibly and contractibly disposed at peripheral positions of the vessel bottom portion 133. When the lock pins 136 are connected to a rotating link mechanism 137 that is disposed at a center portion of the vessel bottom portion 133 and the rotating link mechanism 137 is rotated, the vessel bottom portion 133 is attached to or detached from the vessel main body 132. A handle portion 138 is disposed at an upper portion of the vessel main body 132 of the cassette accommodating vessel. For example, when the operator holds the handle portion 138, he or she can be easily carry the entire cassette accommodating vessel. An example of the cassette accommodating vessel 114 is SMIF-POS (Trade Mark). As shown in FIGS. 11 and 12, the cassette accommodating vessel ports 113 are defined by a cavity of the front wall of the input/output chamber 112. A vessel inlet 140 is formed on the boat holding table 139, which holds the cassette accommodating vessel 114. The size of the vessel inlet 140 is slightly larger than the area of the bottom portion of the cassette accommodating vessel so that the cassette accommodating vessel 114 is input to the input/output chamber 112. A lifting table 142 is disposed at a forward end of an arm 141 of the receiving means 115 so that the vessel inlet 140 is airtightly closed by the lifting table 142. The arm 141 is connected to for example a ball screw 143 so that the arm 141 is vertically moved. Thus, when the cassette accommodating vessel 114 is placed on the lifting table 142 and the lifting table 142 is lowered, the cassette accommodating vessel is input to the input/output chamber 112 as shown in a phantom line of FIG. 11.

A vessel transfer 144 is disposed between the cassette accommodating vessel port 113 and the vessel storage stage 116 in the input/output chamber 112. The vessel transfer 144 serves as vessel transfer means that raises and lowers the cassette accommodating vessel through an elevator 145. The vessel transfer 144 has a bending arm 147. The bending arm 147 is disposed on a base table 146 that rises and lowers along the elevator 145. A pair of chucks 148 are disposed at a forward end of the bending arm 147. The chucks 148 approach to each other so as to hold side walls of the cassette accommodating vessel 114. The lower end of the elevator 145 is movably supported by a guide rail 149 disposed in the alignment direction of the vessel storage stage 116 through for example a bearing 150. Thus, the cassette accommodating vessel 114 placed on the cassette accommodating vessel port 113 is held and transferred by the vessel transfer 144 to the vessel storage stage 116.

A working space S is defined between the elevator 145 and the vessel storage stage 116 so that the cassette accommodating vessel 114 held by the vessel transfer 144 is moved. In this embodiment, the vessel storage stage 116 has a shelf portion 151 with three levels and three rows that are partitioned vertically and horizontally, respectively. Thus, the vessel storage stage 116 can store a total of nine cassette accommodating vessels 114. It should be appreciated that the number of cassette accommodating vessels 114 stored in the vessel storage stage 116 is not limited to nine. If necessary, the number of cassette accommodating vessels 114 can be increased or decreased. However, the number of cassette accommodating vessels 114 should be designated so that they can contain a total of for example 100 wafers. When one cassette contains 25 wafers, the number of cassette accommodating vessels 114 should be four.

A cassette extracting stage 117 on which the cassette C is extracted from the cassette accommodating vessel 114 is disposed at a lower position of the working space S. In reality, the cassette extracting stage 117 has a rectangular-parapellopiped, side-opened casing 153. The open side of the casing 153 is opening toward the wafer transfer 152. The casing 153 is connected to a partition wall 154 that separates the input/output chamber 112 from the load lock chamber 108 and the holding member accommodating chamber 119. Thus, when the cassette C is extracted from the cassette accommodating vessel 114, the wafers W are exposed to the atmosphere of inert gas in the holding member accommodating chamber 119. A cassette inlet hole 155 is formed in a ceiling holding portion 153A of the casing 153. The size of the cassette inlet hole 155 is larger than the inner diameter of the flange portion 132A and smaller than the outer diameter thereof. The cassette inlet hole 155 serves as an opening portion that opens when the cassette C is extracted from the cassette accommodating vessel 114. A vessel bottom portion holding table 156 is disposed at the cassette inlet hole 155. The vessel bottom portion holding table 156 has a peripheral portion with a downward inclination so that it airtightly closes the cassette inlet hole 155. The vessel bottom portion holding table 156 constructs a part of the cassette extracting mechanism 163. A rotating pin 157 is disposed at a center portion of the holding table 156. The rotating pin 175 fits to the rotating link mechanism 137.

When the rotating pin 157 is rotated, the rotating link mechanism 137 works, thereby protruding or contracting the lock pins 136.

As shown in FIG. 15, the vessel bottom portion holding table 156 is disposed at a forward end of a vertical moving arm 159. The vertical moving arm 159 is vertically moved by a ball screw 158 vertically disposed in the casing 153. While the vessel main body 132 is placed on the ceiling holding portion 153A, the vessel bottom portion 133 and the cassette C are lowered and entered into the casing 153, in other words, into the cassette extracting stage 117.

A plurality of key-shaped vessel holders 160 are disposed on the ceiling holder portion 153A corresponding to peripheral positions of the cassette inlet hole 155. When the key-shaped vessel holders 160 are raised and lowered, the flange portion 132A of the vessel is locked and unlocked, respectively.

A wafer transfer 152 is disposed adjacent to the holding member accommodating chamber 119. The wafer transfer 152 is vertically moved and held by a transfer elevator 162. While the wafer transfer 152 is being raised or lowered, it extracts one of the wafers W contained in the wafer carrier C placed on the vessel bottom portion holding table 156 at a time and transfers the wafer to the wafer boat 106 accommodated in the holding member accommodating chamber 119. In addition, the wafer transfer 152 returns the wafers C from the wafer boat 106 to the wafer carrier C held on the vessel bottom portion holding table 156.

Next, the operation of the treatment apparatus according to the second embodiment of the present invention will be described.

First, the operation for conveying the wafers W contained in the cassette C extracted on the cassette extracting stage 117 to the process tube 101 through the load lock chamber 108 will be described.

While the wafer boat 106 is being accommodated in the holding member accommodating chamber 119, the front auto door 120, which closes the holding member accommodating chamber 119 and the input/output chamber 112, is opened so as to connect the holding member accommodating chamber 119 and the cassette extracting stage 117 of the input/output chamber 112. At this point, since the working space S of the input/output chamber 112 and the stage 117 are partitioned, the atmosphere in the working space S does not enter the stage 117. In addition, the atmosphere in the stage 117 does not enter the working space S. In other words, the working space S is filled with air of the clean room with a cleanliness level of for example class 1000. Since the cassette extracting stage 117 is sealed from the working space S by the casing 153 and the like, the air with a low cleanliness level does not enter the cassette extracting stage 117. In this condition, the wafers W contained in the wafer carrier C placed on the vessel bottom portion holding table 156 are transferred to the wafer boat 106 accommodated in the holding member accommodating chamber 119 by the wafer transfer 152. After a predetermined number of (for example 100) wafers are contained in the wafer boat 106, the front auto door 120 is airtightly closed. The holding member accommodating chamber 119 is deaerated so that the inside thereof becomes a predetermined vacuum. Alternatively, a $N_2$ gas is supplied to the wafer boat 106 at a normal pressure or a reduced pressure so that the wafer boat 106 and the wafers W are exposed to the atmosphere of the inert gas, which is the same as the atmosphere in the cassette accommodating vessel 114. Thus, natural oxide films can be prevented from forming on the wafers W. In addition, chemical contamination due to adhesion of particles can be prevented from taking place in the wafers W.

While the holding member accommodating chamber 119 is kept in the vacuum condition, the rear auto door 121 partitioning the holding member accommodating chamber 119 is opened. The conveying mechanism 131 is driven so as to convey the wafer boat 106, which contains the wafers W, to the boat elevator 107A.

The boat elevator 107A is raised and thereby the 100 wafer boat 106 is inserted into the process tube 101. The flange 106A of the wafer boat 106 is brought into contact with the flange 102a of the manifold 102, thereby sealing the process tube 101. The $N_2$ gas in the process tube 101 is exhausted through the exhaust pipe 103. When the inside of the process tube 101 becomes a predetermined vacuum, the predetermined treatment gas is delivered to the process tube 101 through the gas delivery pipe 104 so as to perform the predetermined treatment at a process pressure.

After the treatment is completed, the treatment gas in the process tube 101 is exhausted through the exhaust pipe 103. When the inside of the process tube 101 becomes a predetermined vacuum, the wafer boat 106 is lowered. In the reverse order of the above-described loading operation, the treated wafers W are unloaded.

As described above, the holding member accommodating chamber 119 is disposed between the input/output chamber 112 and the load lock chamber 108. New wafers W, which have not been treated, are contained in the cassette C and conveyed to the holding member accommodating chamber 119, which is filled with the atmosphere of inert gas. Thus, the wafers W are not exposed to air. Consequently, natural oxide films can be prevented from being formed on the surfaces of the wafers W. In addition, since only the holding member accommodating chamber 19 with a relatively small space is kept in a vacuum condition, the wafers W can be quickly placed in the atmosphere of vacuum, thereby reducing the treatment time.

Next, the operation for inputting the cassette accommodating vessel 114 to the input/output chamber 112 and the operation for extracting the wafers W from the cassette accommodating vessel 114 will be described.

The cassette contains for example 25 wafers that have been treated in the preceding step or that have not been treated. The cassette is accommodated in the cassette accommodating vessel 114. The cassette accommodating vessel 114 is placed at a predetermined position of the port holding table 139 (namely, on the lifting table 142) on the cassette accommodating vessel port 113 by the AGV or the operator.

The cassette accommodating vessel 114 is filled with clean air with a high cleanliness level of such as class 1 or an inert gas such as $N_2$ gas for the atmosphere of non-oxygen. Thus, when the cassette accommodating vessel 114 is conveyed to the working region with a low cleanliness level such as class 1000, the wafers W are not exposed thereto. In this embodiment, the cassette accommodating vessel 114 is filled with the atmosphere of $N_2$ gas.

When the vessel main body 114 is placed on the lifting table 142, the receiving means 115, which is disposed below the lifting table 142, is driven so as to lower the lifting table 142. Thus, the cassette accommodating vessel 114 is input to the input/output chamber 112 through the vessel inlet 140 as represented by a phantom line of FIG. 11. After the cassette accommodating vessel 114 is input to the input/output chamber 112, the vessel transfer 144, which is vertically disposed in the input/output chamber 112, is driven. The chucks 148 disposed at the forward end of the bending arm 147 of the vessel transfer 144 nip and hold the side walls of the cassette accommodating vessel 114. After the accommodating vessel 114 is held, the vessel transfer 144 is driven so as to place the cassette accommodating vessel 114 to a desired position of the vessel storage stage 116. In this case, the vessel transfer 144 is vertically moved by the elevator 145. The vessel transfer 144 is horizontally moved along the guide rail 149.

By repeating the above-described input operation, a predetermined number of cassette accommodating vessels 114 can be stored on the vessel storage stage 116. By performing the above-described operation in the reverse order, the cassette accommodating vessels 114 stored on the vessel storage stage 116 can be output to the outside of the treatment apparatus.

When the cassette C is extracted from the cassette accommodating vessel 114, the vessel transfer 144 is driven so as to transfer the cassette accommodating vessel 114 stored on the vessel storage stage 116 to the ceiling holding portion 153A of the cassette extracting stage 117. At this point, the vessel bottom portion holding table 156 of the cassette extracting mechanism 163 is positioned at the uppermost position thereof. Thus, the cassette inlet hole 155 is airtightly closed so that air with a relatively low cleanliness level in the input/output chamber 112 does not enter the casing 153 of the cassette extracting stage 117, which is filled with the atmosphere of N2 gas. It should be appreciated that the cassette accommodating vessel 114 may be conveyed directly to the cassette extracting stage 117, rather than through the vessel storage stage 116.

After the cassette accommodating vessel 114 is placed on the ceiling holding portion 153A, the vessel holders 160 disposed at the peripheral positions of the ceiling holding portion 153A are raised so as to securely lock the flange portion 132A of the vessel main body 132 (see FIG. 15). At this point, the vessel bottom portion 133 of the cassette accommodating vessel 114 is placed on the vessel bottom portion holding table 156 of the cassette extracting mechanism 114. When the rotating pin 157 disposed on the holding table 156 is rotated in the unlock direction, the rotating link mechanism 137 of the vessel bottom portion 133 is rotated, the lock pins 136, which connect the vessel bottom portion 133 and the flange portion 132A, are contracted. Thus, the vessel bottom portion 133 and the flange portion 132A are disconnected.

Next, the cassette extracting mechanism 163 is driven so as to lower the vertical moving arm 159. Thus, as shown in FIG. 11, the vessel bottom portion 133 and the cassette C are extracted into the casing 153, in other words, the vessel bottom portion 133 and the cassette C are extracted into the cassette extracting stage 117. The wafers W contained within the cassette C which is extracted from the cassette accommodating vessel 114, are transferred to the wafer boat 106 by the wafer transfer 152. At this point, since the cassette inlet hole 155 is airtightly closed by the rectangular-parapellopiped vessel main body 132 instead of the vessel bottom portion holding table 156, the air with the relative low cleanliness level in the working space S of the input/output chamber 112 does not enter the cassette extracting stage 117. In addition, since the holding member accommodating chamber 119 is filled with the atmosphere of the N2 gas, the wafers W are not exposed to the atmosphere of an oxidizing gas containing oxygen. Thus, natural oxide films can be remarkably prevented from growing on the wafers W.

When the wafers W contained in the cassette C are transferred to the wafer boat and thereby the cassette C becomes empty, the above-described operation is performed in the reverse order. In other words, the vessel bottom portion holding table 156 is raised. The empty cassette C is accommodated in the cassette accommodating vessel 114. The lock pins 136 of the vessel bottom portion 133 are locked. After the vessel holders are unlocked, the empty cassette accommodating vessel 114 is stored at a predetermined shelf portion 151 of the vessel storage stage 116 by the vessel transfer 144. The cassette accommodating vessel 114, which accommodates the cassette C containing raw wafers W, to the cassette extracting stage 117 by the vessel transfer. 144. Thus, the cassette C is extracted. By repeating the above-described operation, the raw wafers W are transferred to the wafer boat 106. The empty cassette accommodating vessel 114 is stored on the vessel storage stage 116 until the wafers W are treated. By performing the above-described operation in the reverse order, the treated wafers are transferred to the cassette accommodating vessel 114.

According to the second embodiment of the present invention, the cassette accommodating vessel 114, which is filled with the atmosphere of for example an inert gas and sealed from the atmosphere of other chambers, is placed on the cassette accommodating vessel port 113 and then the cassette accommodating vessel 114 enters the treatment apparatus. Thus, it is not necessary to remarkably improve the cleanliness level of the working region, where the operator and the like work, in comparison with the cleanliness level of the conventional treatment apparatus, where exposed wafers are conveyed. For example, in the conventional apparatus, when wafers are conveyed, the cleanliness level of the working region should be class 1 so as to prevent particles from adhering to the wafers. However, according to the second embodiment of the present invention, only the atmosphere in the cassette accommodating vessel 114 should be class 1 of cleanliness level or inert gas. On the other hand, the cleanliness level in the working region can be for example class 1000. Thus, since the cleanliness level of the atmosphere in the working region can be low, the construction cost of the clean room can be reduced. Consequently, the fabrication cost of final products can be remarkably reduced.

In the conventional apparatus, since the wafers are exposed to the atmosphere in the clean room and the input/output chamber for a long time, chemical contamination frequently takes place in the wafers. However, according to the second embodiment of the present invention, since the wafers are contained airtightly in the cassette accommodating vessel 114, which is filled with the atmosphere with a high cleanliness level, just before they are conveyed to the wafer boat. Thus, chemical contamination can be remarkably prevented from taking place in the wafers.

A cassette accommodating vessel 114 that is input to the input/output chamber 112 or an empty cassette accommodating vessel 114 from which wafers are extracted is stored on the vessel storage stage 116 disposed at a remaining space of the input/output chamber 112. Thus, it is not necessary to prepare a storage space for storing empty cassette accommodating vessels 114 in the clean room. Consequently, since the floor space of the clean room is reduced, the construction cost thereof can be reduced.

The input/output chamber 112 (except for the cassette extracting stage 117) is partitioned from the holding member accommodating chamber 119, which is filled with the atmosphere of an inert gas, by the partition wall 154. In addition, since the cassette extracting stage 117 is always filled with the atmosphere of the inert gas, the wafers are always exposed to the atmosphere of the inert gas. Thus, natural oxide films can be remarkably prevented from growing on the surfaces of the wafers. The cassette accommodating vessel 114 is filled with the N₂ gas. In addition, the N₂ gas is supplied to the cassette extracting stage 117, the holding member accommodating chamber 119, and the load lock chamber 108, rather than the input/output chamber 112. Consequently, the consumption amount of the N₂ gas can be remarkably reduced. Consequently, the running cost of the treatment apparatus can be remarkably reduced.

Moreover, the region where the wafers W are extracted from the accommodating vessel is partitioned from the working space S of the input/output chamber 112 where mechanisms such as the receiving means 115 and the vessel transfer 144 that tend to produce particles. Thus, particles can be remarkably prevented from adhering to the wafers. Consequently, the yield of the final products can be improved.

It should be appreciated that the construction of the cassette accommodating vessel according to the second embodiment of the present invention is not limited to the above-described construction. Instead, any construction can be used as long as the cassette accommodating vessel airtightly accommodates the cassette. In addition, the constructions of the cassette extracting mechanism 163 (which inserts and extracts the cassette C into and from the cassette accommodating vessel), the receiving means 115 (which receives the accommodating vessel 114), and the vessel transfer 144 and the bending arm (which convey the accommodating vessel 114 in the treatment apparatus) are not limited to the above-described constructions as long as the similar functions can be accomplished.

In the second embodiment, the loading chamber 108 was explained as the lock chamber, where inert gas can be supplied, exhausted, and deaerated. However, the present invention is not limited to the load lock chamber. Instead, the second embodiment of the present invention can be applied to the treatment apparatus having the conventional loading chamber, where clean air with a high cleanliness level is always circulated at normal pressure.

Figure 17:
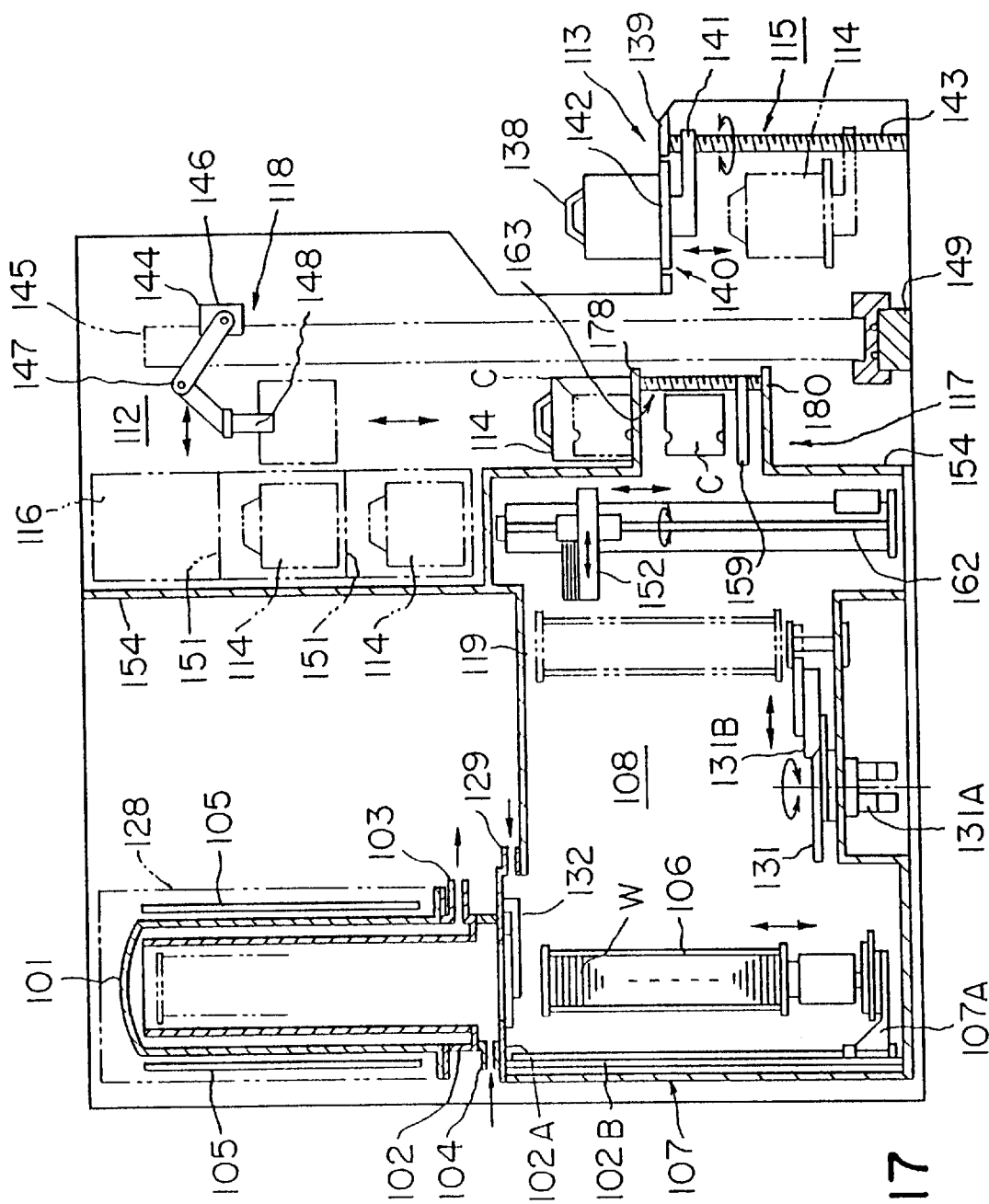
FIG. 17 is a schematic sectional view showing a treatment apparatus according to a modification of the second embodiment of the present invention.
Figure 18:
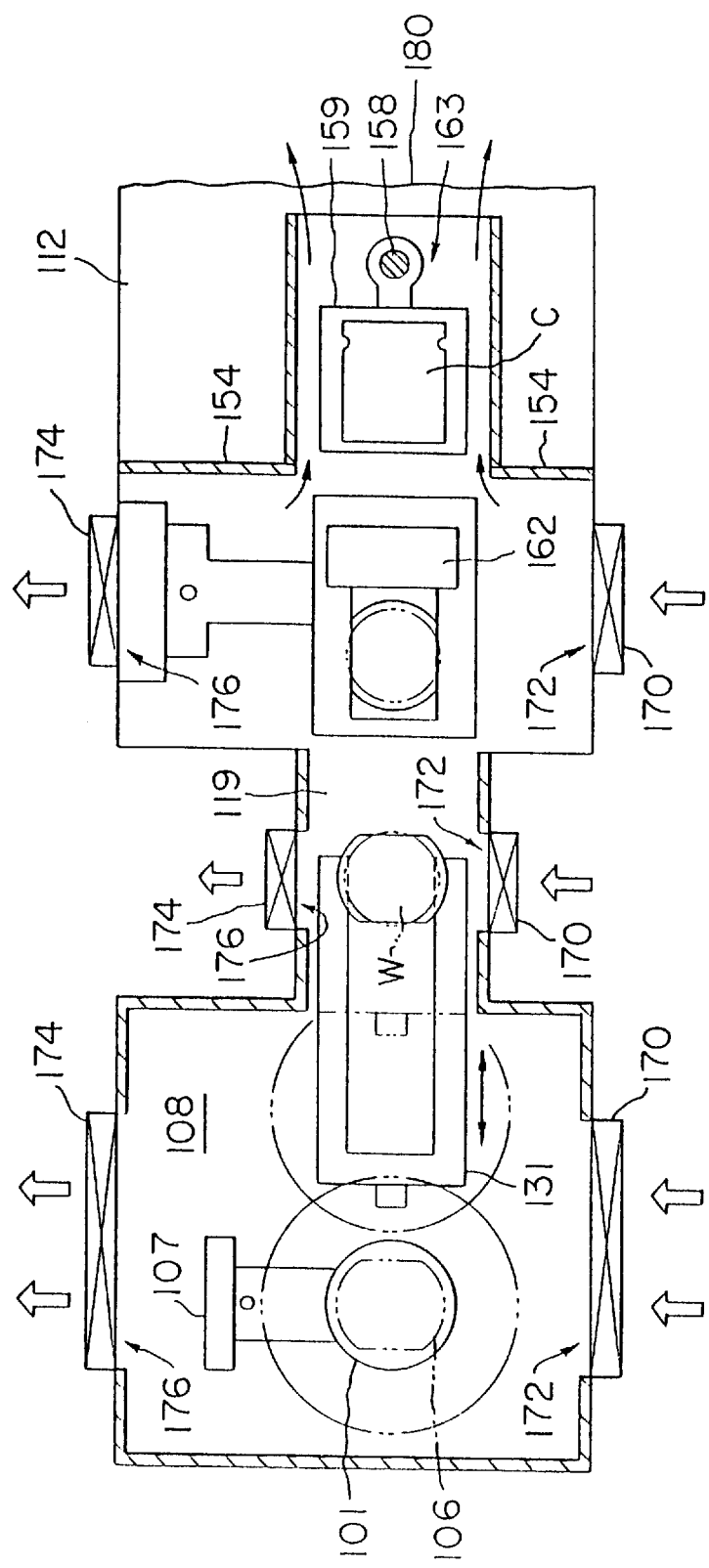
FIG. 18 is a partial- horizontal sectional view showing the treatment apparatus of FIG. 17.

FIGS. 17 and 18 show an example of the treatment apparatus having the conventional loading chamber. This example is hereinafter referred to as a modification of the second embodiment. For the simplicity, the same portions as the treatment apparatus shown in FIG. 11 are denoted by the same reference numerals.

In this treatment apparatus, the loading chamber 108 is always filled with clean air with a high cleanliness level for example class 1 at nearly atmospheric pressure. Thus, unlike with the treatment apparatus according to the second embodiment, the front auto door 120 and the rear auto door 121 (see FIG. 11), which partition the holding member accommodating chamber 119, are omitted. Thus, the holding member accommodating chamber 119 is integrally connected to the loading chamber 108. Clean air delivery openings 172 are formed in a side wall that partitions the chambers 108 and 109 and the accommodating chamber of the transfer elevator 162. The clean air delivery openings 172 have respective filters 170. Air exhaust openings 176 are formed on the other side wall. The air exhaust openings 176 have respective filters 174. Thus, a side flow of clean air is formed in the chambers 108 and 119. Part of air exhausted from the air exhaust openings 176 is returned to the clean air delivery openings 172 and circulated in the chambers 176 and 112.

In this modification, it is not necessary to airtightly partition the loading chamber 108 and the input/output chamber 112. Thus, the side wall of the casing 153, which forms the cassette extracting stage 117, is omitted. Instead, a ceiling portion 178 that holds the cassette accommodating vessel 114 from which the cassette is extracted and a bottom portion 180 that holds a lower portion of the vertical moving arm 159 are required. As shown in FIG. 18, the loading chamber 108 is always connected to the input/output chamber 112 through the cassette extracting stage 117. To prevent air with a low cleanliness level of for example class 100 from entering the loading chamber 108 in which the wafers are exposed, the pressure in the loading chamber 108 is always kept higher than the pressure in the input/output chamber 112. In other words, the loading chamber 108 is positively pressured. Thus, the clean air in the loading chamber 108 always flows to the input/output chamber 112 through the cassette extracting stage 117 In this modification, the same effects as the second embodiment can be obtained.

In the second embodiment and the modification thereof, the holding member accommodating chamber 119 is disposed so as to reduce the consumption amount of the inert gas and to shorten the treatment time. However, the second embodiment and the modification thereof can be applied to the conventional treatment apparatus, which does not have the holding member accommodating chamber 119.

In addition, the second embodiment and the modification thereof may be applied to treatment apparatuses for glass substrates, LCD substrate, and so forth as well as upright type CVD apparatuses and oxide diffusion apparatuses.

As was described above, according to the treatment apparatus of the second embodiment and the modification thereof, the following excellent effects can be obtained.

The workpieces are contained in the cassette. The cassette is accommodated in the cassette accommodating vessel. The cassette accommodating vessel is placed on the cassette accommodating vessel port. The cassette accommodating vessel port is disposed in the input/output chamber so as to input and output the cassette accommodating vessel to and from the treatment apparatus. Thus, the workpieces are input and output to and from the treatment apparatus without being exposed to the atmosphere in the working region. Consequently, it is not necessary to remarkably improve the cleanliness level of the working region outside the treatment apparatus in comparison with the cleanliness level of the conventional treatment apparatus where exposed workpieces are transferred.

Thus, since it is not necessary to remarkably improve the cleanliness level of the working region in the clean room, the construction cost of the clean room and the running cost of the treatment apparatus can be remarkably reduced.

In addition, since a region where empty cassette accommodating vessels are stored is prepared in a remaining space of the treatment apparatus, the floor area of the clean room can be reduced in comparison with the construction where the storage space is provided outside the treatment apparatus. Thus, the construction cost of the clean room can be reduced.

Moreover, since the cassette extracting stage is filled with the atmosphere of inert gas, the workpieces contained in the cassette accommodating vessel can be conveyed and treated without being exposed to air. Thus, natural oxide films can be remarkably prevented from growing on the workpieces.

Third Embodiment

Next, with reference to FIGS. 19 to 25, a third embodiment of the present invention will be described. In the third embodiment, an upright type heat treatment apparatus that is used as an oxidizing apparatus for forming an insulation film on a semiconductor wafer, a CVD apparatus, or the like will be exemplified.

Figure 19:
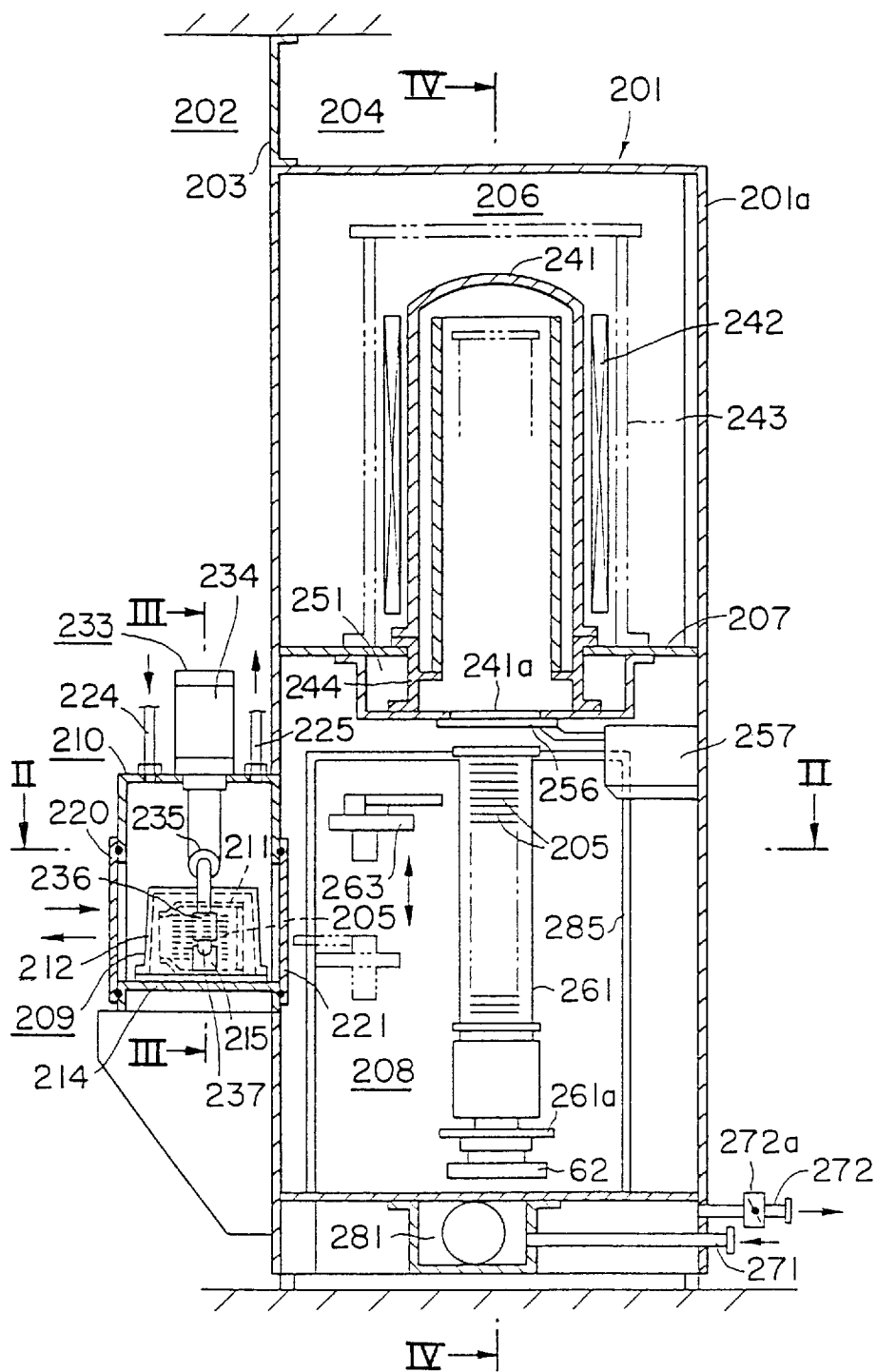
FIG. 19 is a vertical sectional view showing a treatment apparatus according to a third embodiment of the present invention.
Figure 20:
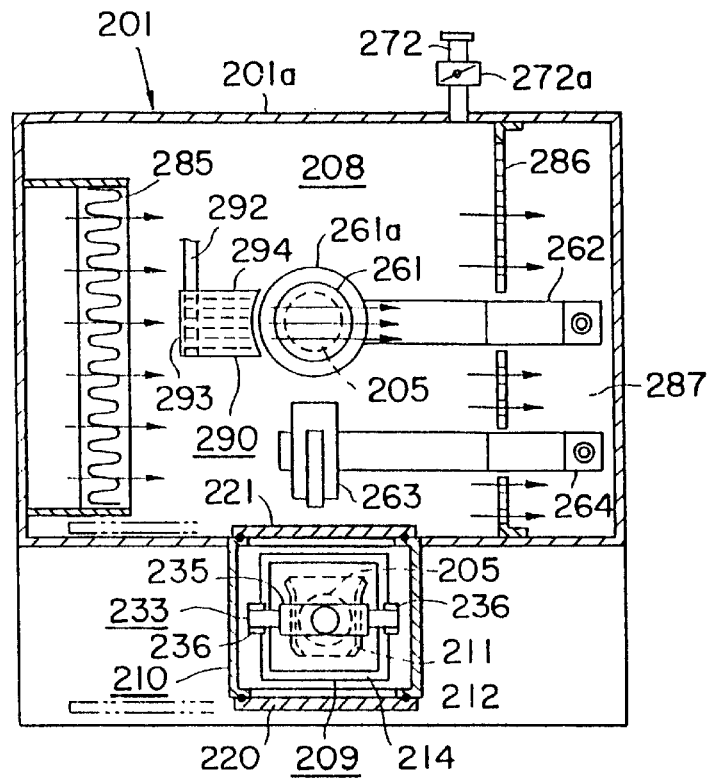
FIG. 20 is a horizontal sectional view taken along line II—II of FIG. 19.
Figure 21:
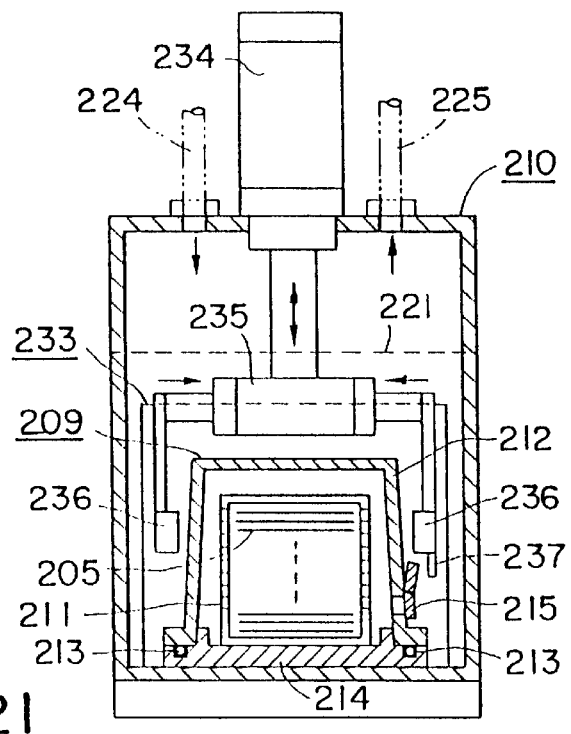
FIG. 21 is a vertical sectional view taken along line III—III of FIG. 19.
Figure 22:
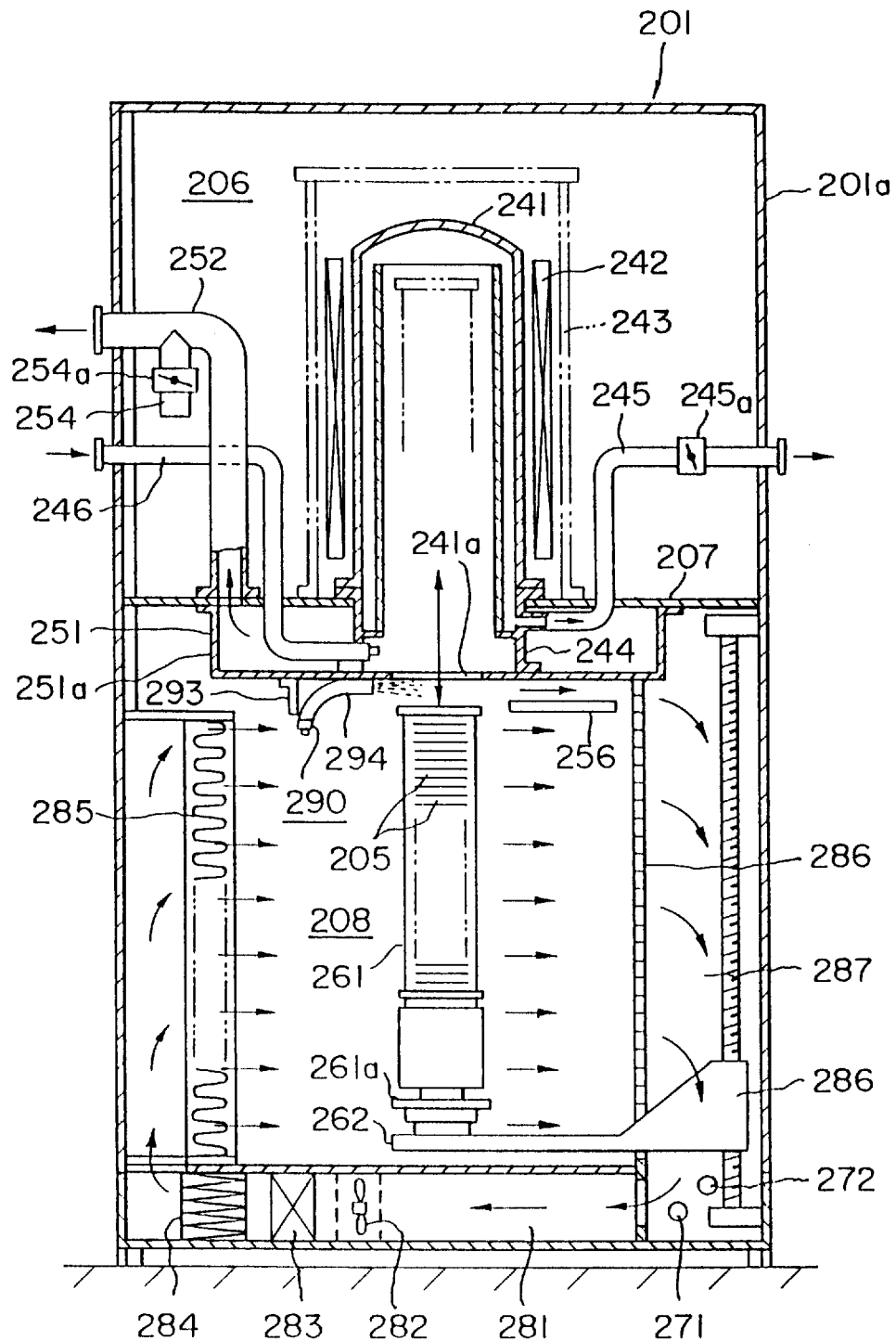
FIG. 22 is a vertical sectional view taken along line IV—IV of FIG. 20.
Figure 23:
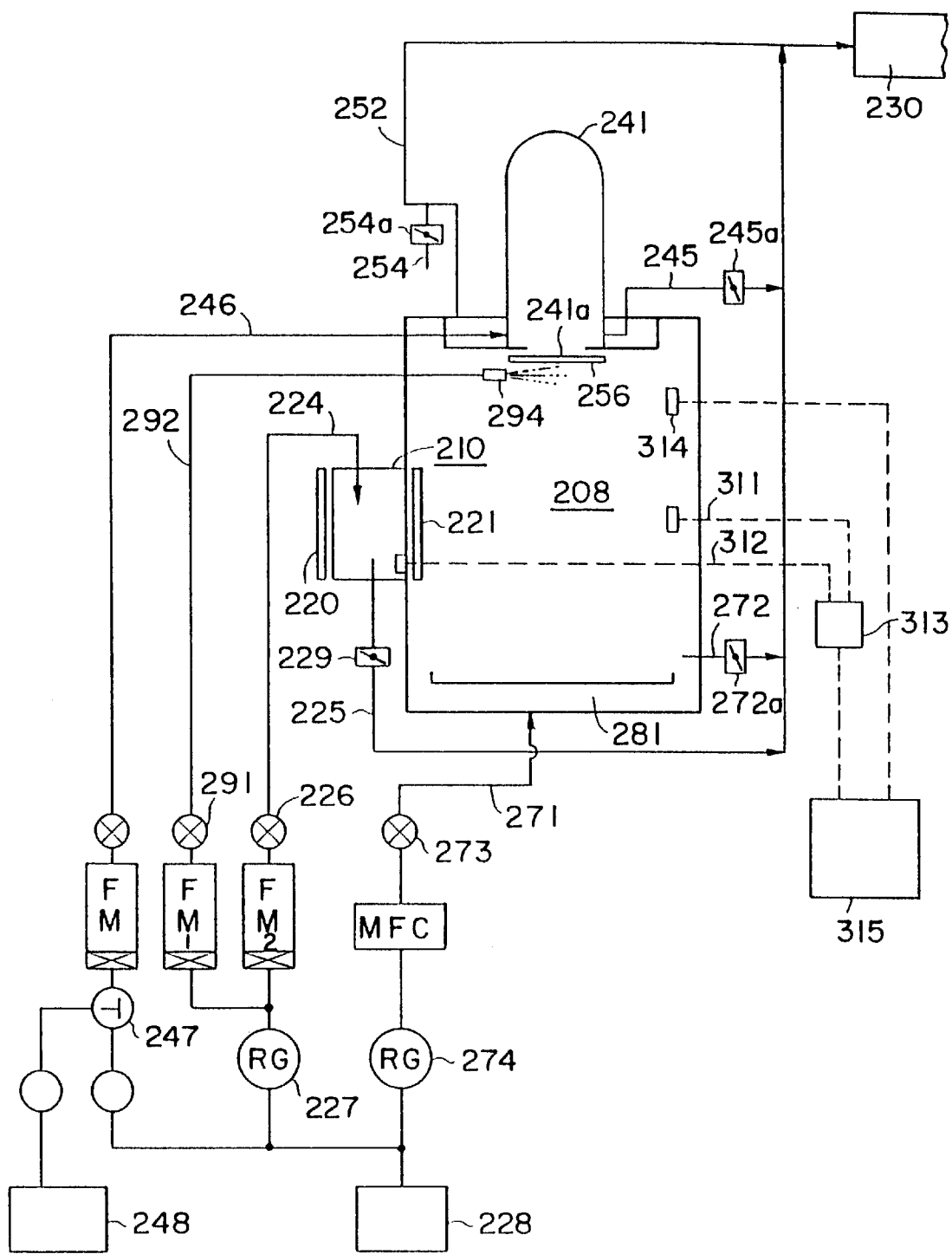
FIG. 23 is a schematic diagram showing a gas control system of the treatment apparatus.

FIG. 19 is a vertical sectional view showing a treatment apparatus according to a third embodiment of the present invention; FIG. 20 is a horizontal sectional view taken along line A—A of FIG. 19; FIG. 21 is a vertical sectional view taken along line B—B of FIG. 19; FIG. 22 is a vertical sectional view taken along line C—C of FIG. 20; and FIG. 23 is a schematic diagram showing a gas control system of the treatment apparatus.

As shown in FIGS. 19 to 23, the upright type heat treatment apparatus according to the third embodiment has an apparatus main body 201. The apparatus main body 201 is constructed of a housing panel 201a in a box shape. A front portion of the apparatus main body 201 is disposed adjacent to a plant clean room 202. The other most portions of the apparatus main body 201 are accommodated in a maintenance room 204. The maintenance room 204 is partitioned by a partition wall 203.

A treatment chamber 206 is disposed in the apparatus main body 204 as an upper half portion thereof. The treatment chamber 206 is partitioned by a partition wall 207. The treatment chamber 206 performs a predetermined treatment for disc-shaped semiconductor wafers 205 as workpieces. A loading area 208 is disposed just below the treatment chamber 206. The loading area 208 is airtightly partitioned by the partition wall 207. The loading area 208 is filled with the atmosphere of an inert gas such as N$_2$. A pass box 210 is disposed at a front portion of the apparatus main body 201. The pass box 210 receives an accommodating vessel 209 that contains the semiconductor wafers 205.

Next, each portion of the treatment main body 201 will be described in detail. As shown in FIGS. 19 to 21, the accommodating vessel 209 accommodates a cassette (cage-shaped carrier) 211 that contains a large number of semiconductor wafers 205 as workpieces. The semiconductor wafers 205 are provided in a parallel manner within the cassette 211. Thus, the semiconductor wafers 205 are conveyed by the accommodating vessel 209. The accommodating vessel 209 comprises a hat-shaped box main body 212 and a lid 214. The box main body 212 is open-bottomed. The lid 214 is connected to the bottom through a seal member 213. An inert gas valve 215 is disposed on a side wall portion of the box main body 212. The inert gas valve 215 is normally closed.

The inert gas such as N$_2$ gas is supplied to the box main body 212 through the gas valve 215. Thus, the atmosphere in box main body 212 is substituted with the inert gas. When the inert gas is exhausted from the box main body 212 through the gas valve 215, the inside of the box main body 212 is negatively pressured. Consequently, the lid 214 is attracted to the box main body 212 through the seal member 213, thereby sealing the box main body 212. On the other hand, when the inert gas is supplied through the gas valve 215, the inside of the box main body 212 is positively pressured. At this point, when the box main body 212 is raised, it is separated from the lid 214. In this condition, the cassette 211, which contains the semiconductor wafers 205 can be inserted and extracted into and from the box main body 212. In addition, the semiconductor wafers 205 can be inserted and extracted into and from the cassette 211.

The pass box 210 is a small (capacity) box that is integral with the front housing panel 201a of the apparatus main body 201. Slide-open-type auto doors 220 and 221 are disposed on a front portion and a rear portion of the pass box 210, respectively. The rear portion of the pass box 210 is disposed adjacent to the treatment apparatus main body 201. The auto doors 220 and 221 have respective open/close drive portions. The auto doors 220 and 221 can be independently and airtightly closed through respective seal members. When the front (outer) auto door 220 is opened, the accommodating vessel 209, which accommodates the semiconductor wafers 205, can be smoothly inserted and extracted into and from the pass box 210 by a conveying means. When the inner (rear) auto door 221 is opened, the pass box 210 is connected to the loading area 208 of the treatment apparatus main body 201.

A gas delivery pipe 224 and a gas exhaust pipe 225 that serve as a gas supply and exhaust means are connected to the pass box 210. The gas delivery pipe 224 and the gas exhaust pipe 225 substitute the atmosphere in the pass box 210 with inert gas. As shown in FIG. 23, the gas delivery pipe 224 is connected to an inert gas supply unit 228 through a valve 226 and a regulator 227. Thus, an inert gas such as N$_2$ gas is supplied to the pass box 210 through the gas delivery pipe 224. On the other hand, the gas exhaust pipe 225 is connected to a plant exhaust unit 230 with a blower through an auto dumper 229. Thus, the waste gas in the pass box 210 is exhausted.

The pass box 210 has a lid removing mechanism 233. The lid removing mechanism 233 comprises a lifting air cylinder 234, an opening/closing air cylinder 235, and a pair of clamp arms 236. The lifting air cylinder 234 is disposed on an upper plate of the pass box 210. The opening/closing air cylinder 235 is supported at a lower end of the piston rod. The clamp arms 236 are supported on both ends of the piston rod of the opening/closing air cylinder 235. The opening/closing air cylinder 235 causes the left and right clamp arms 236 to approach to each other in the atmosphere of inert gas in the pass box 210 and grip the box main body 212 of the accommodating vessel 209. The lifting air cylinder 234 causes the box main body 212 to be raised, thereby separating the box main body 212 from the lid 214.

The lid removing mechanism 233 has a rod-shaped valve operating portion 237. The rod-shaped valve operating portion 237 is disposed at a lower end of one of the left and right clamp arms 236. When the lid 214 is opened, the left and right clamp arms 236 grip the box main body 212 of the accommodating vessel 209. In addition, the valve operating portion 237 opens the inert gas valve 215, which is usually closed, of the box main body 212. Thus, the inside of the accommodating vessel 209 is pressured so that the pressure therein becomes the same as the pressure in the pass box 210, thereby separating the box main body 212 from the lid 214.

An upright type process vessel 241 is disposed in the treatment chamber 206 of the treatment apparatus main body 201. The process vessel 241 is a heating furnace referred to as a process tube. The process vessel 241 is made of for example quartz. The process vessel 241 is an invert-U-shaped vessel. In other words, the upper end of the process vessel 241 is closed. A heater 242 is disposed on the outer periphery of the process vessel 241. In addition, a protection cover 243 containing a cooling pipe, a heat insulating material, and so forth is disposed around the heater 242.

A manifold 244 is connected to the lower end of the opening of the process vessel 241. The manifold 244 is formed in a cylindrical shape. The manifold 244 has an upper flange and a lower flange. As shown in FIG. 22, an exhaust pipe 245 with an auto dumper 245a is connected to a peripheral wall portion of the manifold 244. The exhaust pipe 245 exhausts the gas in the process vessel 241. The exhaust pipe 245 extends to the outside of the apparatus main body 201 and is connected to the plant exhaust apparatus 230. In addition, a gas delivery pipe 246 is disposed on the peripheral wall of the manifold 244. The gas delivery pipe 246 delivers new gas to the process vessel 241. The gas delivery pipe 246 extends to the outside of the apparatus main body 201 and is connected to a treatment gas supply unit 248 and an inert gas supply unit 228 through an automatic switch valve 247 that alternately delivers the treatment gas and the inert gas ($N_2$ gas) to the process vessel 241.

A doughnut-shaped scavenger 251 is disposed around the manifold 244. The scavenger 251 is constructed of the partition wall 207 and an angular dish-shaped case 251a. The case 251a is secured to the lower surface of the partition wall 207. A heat exhaust pipe 252 extends from the scavenger 251 to the outside of the treatment apparatus main body 201 and is connected to the plant exhaust unit 230. The heat exhaust pipe 252 always exhausts heat that stays at a lower portion of the process vessel 241 and waste gas. A branch pipe 254 with an auto dumper 254a is disposed in the treatment chamber 206 and connected in the middle of the heat exhaust pipe 252.

An opening is formed at a bottom center portion of the case 251a of the scavenger 251. The opening constructs a furnace opening portion 241a of the process vessel 241. An auto shutter 256 is disposed in the loading area 208. The auto shutter 256 airtightly closes the furnace opening portion 241a through an O ring. The auto shutter 256 is vertically and horizontally rotated by an open/close drive portion 257, thereby opening and closing the furnace opening portion 241a.

A wafer boat 261 and a boat elevator 262 are disposed in the loading area 208. The wafer boat 261 and the boat elevator 262 serve as a loading mechanism that loads and unloads the semiconductor wafers 205 into and from the process vessel 241. The wafer boat 261 is made of quartz and formed in a tower shape. The wafer boat 261 contains a large number of semiconductor wafers 205 that are arranged in vertical direction at predetermined pitches.

The wafer boat 261 is supported by the wafer elevator 262 so that the wafer boat 261 is positioned just below the furnace opening portion 241a of the process vessel 241. When the shutter 256 is opened, the wafer boat 261, which contains the semiconductor wafers 205, is raised and loaded into the process vessel 241 by the boat elevator 262. In addition, the wafer boat 261 is lowered and unloaded from the process vessel 241 by the boat elevator 262. When the wafer boat 261 is raised and loaded into the process vessel 241, a lower flange 261a of the wafer boat 261 instead of the auto shutter 256 closes the furnace opening portion 241a, thereby airtightly closing the process vessel 241.

A transfer unit (wafer transfer) 263 is disposed between the wafer boat 261 and the pass box 210. The transfer unit 263 serves as a transfer means that transfers workpieces to the apparatus main body. The transfer unit 263 is raised and lowered by a transfer elevator 264. When the auto door 221 in the pass box 210 is opened, the transfer unit 263 extracts one of the semiconductor wafers 205 from the cassette 211 in the accommodating vessel 209 at a time and transfers it to the wafer boat 261. In addition, the transfer unit 263 returns the semiconductor wafers 205 contained in the wafer boat 261 to the cassette 211.

A gas delivery pipe 271 and a gas exhaust pipe 272 are provided as a gas supply and exhaust means that substitutes the atmosphere in the loading area 208 of the apparatus main body 201 with the atmosphere of inert gas at a positive pressure. The gas delivery pipe 271 is connected to a primary side (air intake side) of a blowing fan 282 disposed in the middle of a return passageway 281. The return passageway 281 is disposed below the floor of the apparatus main body 201. The gas delivery pipe 271 extends to the outside of the apparatus main body 201. As shown in FIG. 23, the gas delivery pipe 271 is connected to an inert gas supply unit 228 through a flow rate adjustment valve 273 and a regulator 274. Thus, the N2 gas, which is an inert gas, is delivered to the loading area 268 through the return passageway 281. The gas exhaust pipe 272 extends from the downstream side of the loading area 208. An auto dumper 272a is disposed in the middle of the exhaust pipe 272. The exhaust pipe 272 is connected to the plant exhaust unit 230.

When the atmosphere in the treatment apparatus main body is initially substituted, the auto dumper 272a is opened. Thus, the atmosphere in the loading area 208 is exhausted by the plant exhaust unit 246. In addition, the $N_2$ gas is supplied to the loading area 208 at a flow rate of around 200 to 400 liters/min. In the normal operation state after the substitution, the N2 gas is supplied at a flow rate of around 50 liters/min. At this point, the auto dumper 272a of the gas exhaust pipe 272 is closed. Thus, the inside of the loading area 208 is kept at a proper positive pressure of the atmosphere of $N_2$ gas by a gap gas exhaustion or a pressure adjustment dumper. The leaked gas by the gas exhaustion is exhausted from the plant through the branch pipe 254 with the auto dumper 254a of the heat exhaust pipe 252 of the scavenger 251.

A gas circulation type cooling and cleaning system is provided. When the treatment operation of the semiconductor wafers 205 is repeated, the cleanliness level of the $N_2$ gas in the loading area 208 lowers and the temperature therein rises. The gas circulation type cooling and cleaning system keeps the cleanliness level of the atmosphere of $N_2$ gas in the loading area 208 high and prevents the temperature therein from abnormally rising. As a system construction of the gas circulation type cooling and cleaning system, waste $N_2$ gas is exhausted from the loading area 208 to the outside of the treatment apparatus. After the waste $N_2$ gas is cleaned and cooled, the clean and cold $N_2$ gas is returned to the loading areas 208 through a return passageway 281. The return passageway 281 is disposed below the floor of the treatment apparatus main body 201. A blowing fan 282 is disposed in the middle of the return passageway 281. A gas cleaning unit 283 is disposed on the secondary side of the air blowing fan 282. In addition, a gas cooling unit 284 is disposed on the secondary side of the air blowing fan 282.

The gas cleaning unit 283 is a chemical filter that contains a disposable metal getter made of zirconia or the like, which absorbs gas impurities (moisture, oxygen, hydrocarbon, and so forth). The gas cooling unit 284 is of a radiator type and constructed of a water cooling pipe and heat radiating fins disposed thereon. The gas cooling unit 284 has a cooling capacity for causing the temperature of gas exhausted from the secondary side to be kept at 50° C. or below.

A filter 285 is disposed on one inner side surface of the loading area 208. The filter 285 receives $N_2$ gas from the return passageway 281 and forces clean $N_2$ gas into the loading area 208. The filter 285 is an upright type ULPA grade absolute filter. The filter 285 filters fine granular impurities (particles such as dust) contained in the N2 gas and forces the filtered N2 gas into the loading area 208 as a side flow from one side thereof. A flow regulating plate 286 is opposed to the filter 285. The flow regulating plate 286 has a plurality of holes so as to strengthen the side flow of the $N_2$ gas. The $N_2$ gas flows from a rear space 287 of the flow regulating plate 286 to the return passageway 281.

A gas shower mechanism 290 is disposed at an upper portion of the loading area 208. As shown in FIG. 23, the gas shower mechanism 290 comprises a gas delivery pipe 292 and a special nozzle 294. The gas delivery pipe 292 is connected to the inert gas supply unit 228 through a valve 291 and the regulator 227. The special nozzle 294 is connected to a forward end of the gas delivery pipe 292 and secured to a lower surface of the case 251*a* of the scavenger 251 through a bracket 293.

The special nozzle 294 is flat-shaped and has a width that covers the diameter (200 mm) of the semiconductor wafers. In addition, the special nozzle 294 has a long landing distance. When the wafer boat 261 is loaded and unloaded into and from the process vessel 241, the special nozzle 294 blows the $N_2$ gas into a lower position of the furnace opening portion 241*a* of the process vessel 241 at a flow rate of 50 to 100 liters/min as a side flow. The flow rate of the $N_2$ gas blown from the special nozzle 294 is higher than the flow rate (0.75 m/sec) of the side flow of the ULPA filter 285 so as to purge impurities such as $O_2$ and a heat gas, which stay among the semiconductor wafers 205 contained in the wafer boat 261.

As shown in FIG. 23, gas delivery pipes 311 and 312 are disposed as an oxygen concentration detecting means that detects the concentration of oxygen in the loading area 208 and the pass box 210, respectively. The gas delivery pipes 311 and 312 are connected to an oxygen concentration meter ($O_2$ sensor) 313. The oxygen concentration meter 313 has a three-way switch valve and a gas delivery pump. The oxygen concentration meter 313 measures the concentration of oxygen in the loading area 208 and the pass box 210 so as to determine whether the concentration of oxygen is 20 ppm or below.

A controller 315 is provided that receives signals from both the oxygen concentration meter 313 and a pressure sensor 314 that measures the air pressure in the loading area 208. The controller 315 outputs control commands to operating portions such as the auto dumpers 229, 245*a*, 254*a*, and 272*a*, the valves 226, 247, 273, and 291, the auto doors 220 and 221, the auto shutter 256, the transfer unit 263, the boat elevator 262, and so forth so as to sequentially control these portions.

Next, the operations of the above-mentioned upright type heat treatment apparatus and the accommodating vessel 209 will be described. Since the loading area 208 of the treatment apparatus main body 201 is relatively narrow, when the atmosphere in the loading area 208 is initially substituted, the auto dumper 272*a*, which serves as the gas supply and exhaust means, of the exhaust pipe 272 is opened. The atmosphere in the loading area 208 is exhausted by the plant exhaust unit 230. In addition, $N_2$ gas is delivered to the loading area 208 from the gas delivery pipe 271 at a flow rate of around 400 liters/min. Thus, with a relatively small amount of N2 gas, the atmosphere in the loading area 208 can be substituted.

In the normal operation state after the gas substitution, the amount of the $N_2$ gas delivered from the gas delivery pipe 271 is reduced to a flow rate of around 50 liters/min. The auto dumper 272*a* of the gas exhaust pipe 272 is closed. The pressure in the loading area 208 is kept at a proper positive pressure that is higher than the air pressure in the clean room 202 by around 0.2 mm $H_2O$ by the gap gas exhaustion in the loading area 208 or the pressure adjusting dumper. The leaked gas by the gap gas exhaustion is always exhausted from the branch pipe 254 with the auto dumper 254*a* of the heat exhaust pipe 252 to the plant exhaust system.

$N_2$ gas is continuously delivered from the gas delivery pipe 224, which serves as the gas supply and exhaust means, to the pass box 210 at a flow rate of 50 liters/min. In addition, the waste $N_2$ gas is purged from the pass box 210 through the exhaust pipe 225. Thus, the atmosphere in the pass box 210 is substituted with the $N_2$ gas.

The semiconductor wafers 205, which are workpieces, are contained in the cassette in another chamber that is filled with $N_2$ gas. The cassette is placed on the lid 214 of the accommodating vessel 209. The cassette is covered with the box main body 212. The $N_2$ gas is properly exhausted from the accommodating vessel 209 so that the inside of the accommodating vessel 209 is negatively pressured. Thus, the box main body 212 is attracted and airtightly closed by the lid 214. The semiconductor wafers 205 are contained in the cassette 211 in the atmosphere of the inert gas rather than air. The cassette 211 is conveyed to the treatment apparatus by a conveying means such as a robot.

When the accommodating vessel 209 approaches the treatment apparatus, only the outer auto door 220 thereof is opened and the accommodating vessel 209 is entered into the pass box 210. At this point, air temporarily enters the pass box 210. However, since the outer auto door 220 and the inner auto door 221 are closed and the delivery amount of the $N_2$ gas supplied from the gas delivery pipe 224 is increased, air and impurities that adhere to the outer surface of the accommodating vessel 209 are purged from the pass box 210 and substituted with the $N_2$ gas.

Since the volume of the pass box 210 is small and the outer shape of the accommodating vessel 209 is smooth and simple, with a relatively small amount of gas delivered from the gas delivery pipe 224, air and impurities can be securely purged from the pass box 210 and quickly substituted with the inert gas with a high cleanliness level.

Thereafter, the lid removing mechanism 233 is lowered. The left and right clamp arms 236 of the lid removing mechanism 233 grip the box main body 212. At this point, the valve operating portion 237 pushes and opens the inert gas valve 215, which is normally closed. Thus, the pressure in the accommodating vessel 209 becomes the same as the pressure in the pass box 210. Consequently, the lid 214 is separated from the box main body 212. The box main body 212 is raised so as to open the lid 214.

At this point, the inner auto door 221 of the pass box 210 is opened. The transfer unit 263, which serves as the transfer means, is extended to the inside of the pass box 210. The transfer unit 263 successively extracts one of the semiconductor wafers 205 from the cassette 211 disposed on the lid 214 of the accommodating vessel 209 at a time and transfers it to the wafer boat 261.

The auto shutter 256 is opened and the semiconductor wafers 205 on the wafer boat 261 are raised and loaded into the process vessel 241 of the treatment chamber 206 by the boat elevator 205. The furnace opening portion 241*a* is closed by the lower flange 261*a* of the wafer boat 261. The atmosphere of the $N_2$ gas is purged from the process vessel 241 through the air exhaust pipe 245. The process gas is delivered from the gas delivery pipe 246 to the process vessel 241. The semiconductor wafers 205 is heated by the heater 242 so as to perform a predetermined treatment.

After the treatment is completed, in the reveres order of the above-described operation, the treatment gas is purged from the process vessel 241 through the exhaust pipe 245.

N₂ gas is delivered to the process vessel 241 from the gas delivery pipe 246. Thus, the treatment gas in the process vessel 241 is substituted with the atmosphere of N₂ gas, which is the same as the atmosphere in the loading area 208. The wafer boat 261 is lowered by the boat elevator 261 and placed in the loading area 208. At this point, only the inner auto door 221 of the pass box 210 is opened. The transfer unit 263 extracts the treated semiconductor wafers 205 from the wafer boat 261 and returns these semiconductor wafers 205 to the cassette 211 placed in the pass box 210.

The inner auto door 221 of the pass box 210 is closed. At this point, the lid removing mechanism 233 is lowered. Thus, the box main body 212 of the accommodating vessel 209 is placed on the lid 214. At this point, the inert gas valve 215 is kept open by the valve operating portion 237. In this condition, the N₂ gas in the pass box 210 is purged by a sucking blower to the gas exhaust pipe 225 through the auto dumper 229. Thus, the inside of the pass box 210 and the accommodating vessel 209 is negatively pressured (at an air pressure of around 760 mm H₂O).

The lid removing mechanism 233 moves from the box main body 212. Thereafter, the lid removing mechanism 233 rises. Thus, the gas valve 215 is closed and thereby the pressure in the pass box 210 becomes normal pressure. Since the pressure in the accommodating vessel 209 is lower than the pressures in other portions, the lid 214 is attracted to the box main body 212, thereby closing the pass box 212.

In this condition, only the outer auto door 220 of the pass box 210 is opened. The accommodating vessel 209, which accommodates the cassette 211 containing the treated semiconductor wafers 205 in the atmosphere of the N₂ gas, is conveyed to the outside of the treatment apparatus by a proper conveying means.

As described above, the semiconductor wafers 205 are conveyed from the outside to the treatment apparatus or vice versa in the atmosphere of an inert gas rather than air. Thus, air (O2), gas impurities, and particle impurities can be easily and securely prevented from adhering to the semiconductor wafers and entering the treatment apparatus. Consequently, the consumption amount of inert gas can be reduced and thereby the fabrication cost of the semiconductor wafers 205 can be lowered. In addition, the loading area 209 can be positively pressured and filled with the atmosphere of the inert gas with a high cleanliness level. Thus, when the semiconductor wafers 205 are loaded and unloaded into and from the process vessel 241, natural oxide films can be prevented from being formed on the semiconductor wafers 205, impurities from adhering thereto, and chemical reactions from taking place thereon.

As the above-described semiconductor wafer treatment operation is repeated, gas impurities (such as carbon) and particle impurities (such as oil mist and dust) may be contained in the atmosphere of the N₂ gas in the loading area 208. In addition, the temperature of the atmosphere of the N₂ gas in the loading area 208 may rise due to heat emission from the process vessel 241, radiant heat from the treated semiconductor wafers 205 heated at a high temperature (around 1000° C.), and so forth.

However, clean N₂ gas, which is a purge gas, is always delivered from the gas delivery pipe 271 to the loading area 208. The gas circulation type cooling and cleaning system always works. The N₂ gas in the loading area 208 is blown into the return passageway 281 through the flow regulating plate 286 by the blowing fan 282 along with impurities. The N₂ gas and the impurities are blown into the gas cleaning unit 283. The gas cleaning unit 283 absorbs gas impurities (moisture, oxygen, hydrocarbon, and so forth). In addition, the N₂ gas is blown into the gas cooling unit 284. The gas cooling unit 284 cools the N₂ gas so that the temperature thereof becomes 50° C. or below. The ULPA grade absolute filter 285 filters particles (such as dust) contained in the N₂ gas and blows the filtered N₂ gas into the loading area 208. In addition, part of the N₂ is returned to the loading area 208 as a side flow. Thus, the atmosphere of the N₂ gas in the loading area 208 is kept in a high cleanliness level. In addition, the atmosphere of the N₂ gas can be prevented from abnormally rising.

When the wafer boat 261 is loaded and unloaded into and from the process vessel 241, the gas shower mechanism 290 works. In other words, the special nozzle 294 blows a N₂ gas into a position below the furnace opening portion 241a at a high speed as a side flow. The N₂ gas shower purges impurities (such as O₂) and heat, which stay among the semiconductor wafers 205, which are vertically arranged on the wafer boat 261.

Thus, when the semiconductor wafer 205 is loaded and unloaded into and from the process vessel 241, gas impurities (such as carbon) and particle impurities (such as oil mist and dust) can be prevented from adhering to the semiconductor wafers 205, and chemical contamination from taking place therein. Thus, the characteristics and yield of the fabrication of semiconductor devices can be prevented from degrading.

Next, with reference to FIG. 24, a first modification of the third embodiment of the present invention will be described. For the simplicity, the same portions as the treatment apparatus shown in FIGS. 19 to 23 are denoted by the same reference numerals and their description is omitted.

The width of a treatment apparatus main body 201 of an upright type heat treatment apparatus of this modification is larger than the width of the treatment apparatus main body 201 of the third embodiment. In addition, in the modification, a cassette stock stage 320 is provided. The cassette stock stage 320 holds a plurality of cassettes 211 that contain workpieces.

In other words, an upper half portion of a rear portion in the treatment apparatus main body 201 is partitioned by a partition wall 207. This upper half portion is a treatment chamber 206 that performs a predetermined treatment for semiconductor wafers 205 that are workpieces. A loading area 208 is disposed just below the treatment chamber 206. A workpiece input/output area 321 is disposed upstream of the treatment chamber 206 and the loading area 208.

A pass box 210 is disposed at a front portion of the workpiece input/output area 321. A cassette transfer 322 is disposed just behind the pass box 210. The cassette transfer 322 is raised and lowered by the elevator 323. A cassette stock stage 320 is disposed at an upper half portion of the workpiece input/output area 321. The cassette stock stage 320 has a cassette stock shelf 320a that has a plurality of levels (for example, four levels). The cassette 211, which contains the semiconductor wafers 205, is transferred from the cassette box 210 to a level of the cassette stock shelf 320a by the cassette transfer 322. A transfer stage 324 is disposed just below the cassette stock stage 320. The transfer stage 324 is supported by a stand 325. The transfer stage 324 has two levels. The cassettes 211 are extracted from the cassette stock stage 320 and placed on the respective levels of the transfer stage 324. A transfer unit (wafer transfer) 263 is raised and lowered along the transfer stage 324. The transfer unit 263 extracts one of the semiconductor wafers 205 contained in the cassette 211 on the transfer stage 324 at a time and transfers it to the wafer boat 261 in the loading area 208. In addition, the transfer unit 263 returns the treated semiconductor wafers 205 contained in the wafer boat 261 to the cassette 211 on the transfer stage 324. The constructions of other portions of this modification are the same as the constructions of the third embodiment shown in FIGS. 19 to 23.

In the third embodiment shown in FIGS. 19 to 24, the gas valve 215 is disposed on the box main body 212 of the accommodating vessel 209. The pressure in the accommodating vessel 209 is reduced through the gas valve 215. Thus, the lid 214 is attracted to the box main body 212 and thereby the box main body 212 is closed by the lid 214. In other words, in the third embodiment, vacuum method is used. However, the lid 214 may be driven by a mechanical clamp mechanism or an electric magnet (that are not shown) so as to close and open the box main body 212. In this construction, the gas valve 215 can be omitted.

Next, with reference to FIG. 25, a second modification of the third embodiment will be described. In this modification, the accommodating vessel 209 is used in common with the pass box. Thus, the pass box used in the third embodiment is omitted.

Figure 25:
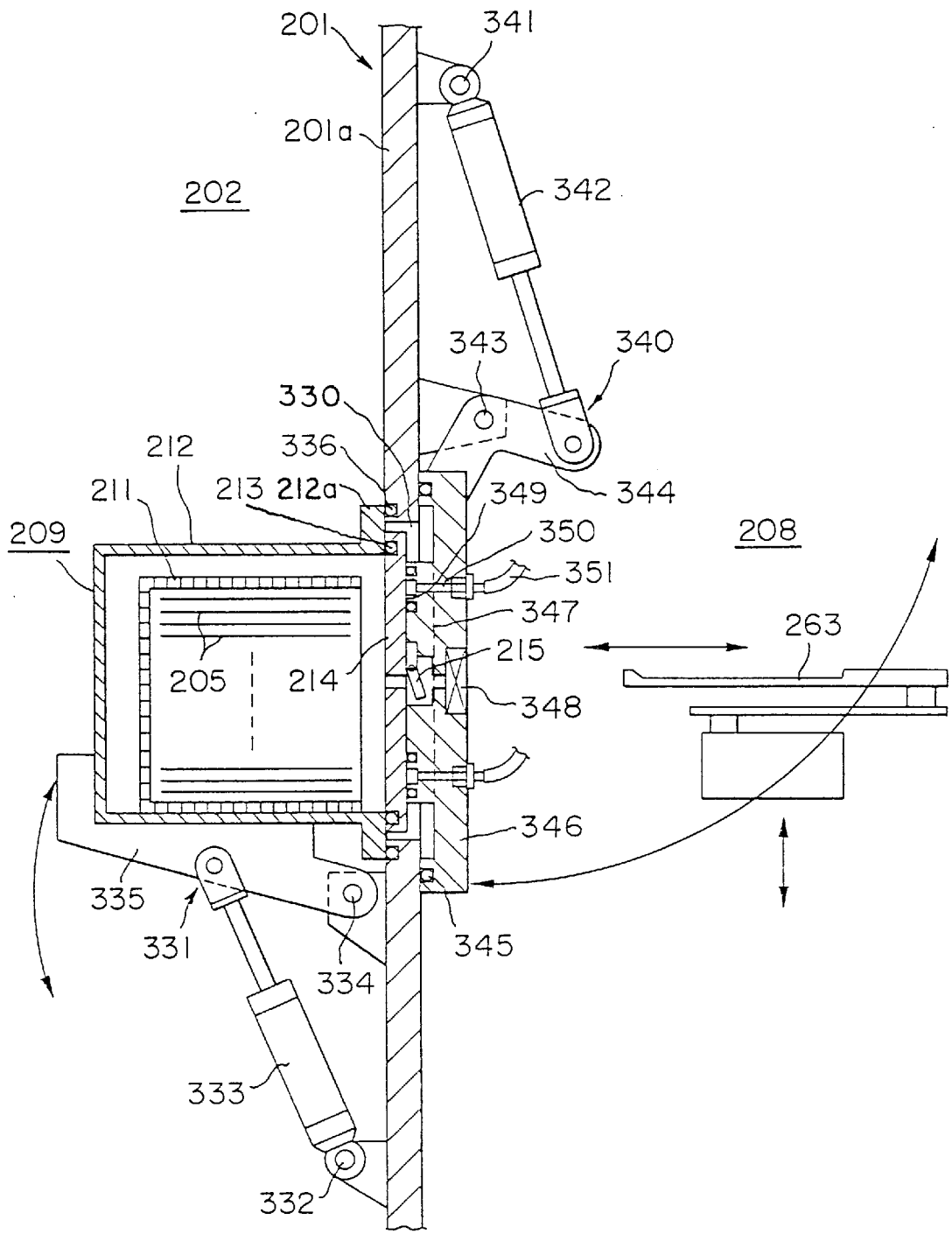
FIG. 25 is a partial vertical sectional view showing an upright type heat treatment apparatus according to another modification of the third embodiment of the present invention.

FIG. 25 is an enlarged sectional view showing a front panel portion of a housing panel 201*a* of a treatment apparatus main body 201 of an upright type heat treatment apparatus that is the same as the upright type heat treatment apparatus according to the third embodiment shown in FIG. 19. As described above, the pass box 210 is omitted in this modification. Instead, a workpiece inlet/output opening 330 is formed on the front panel portion of the treatment apparatus main body 201. In addition, a box holding mechanism 331 is disposed at an outer lower position of the housing panel 201*a*. A lid removing door mechanism 340 is disposed on the inner surface of the housing panel 201*a*. The lid removing door mechanism 340 closes the workpiece inlet/output opening 330.

The box holding mechanism 331 comprises an air cylinder 333 and a support arm 335. A lower end of the air cylinder 333 is pivoted to the outer surface of the front panel portion of the treatment apparatus main body 201 through a hinge 332. The support arm 335 is supported at an upper end of a piston rod of the air cylinder 333 and vertically movable about a hinge 334. The accommodating vessel 209 that is conveyed by a proper means from the outside of the treatment apparatus main body 201 is held by the support arm 335. A rear end of the accommodating vessel 209 is airtightly connected to the workpiece inlet/outlet opening 330.

The accommodating vessel 209 of this modification comprises a box main body 212, a lid 214, and an inert gas valve 215. The box main body 212 has an opening at an rear end portion thereof so as to accommodate a cassette 211 that contains a large number of semiconductor wafers 205, which are workpieces. The lid 214 is connected to the opening with a rear end flange 212*a* of the box main body 212 through a seal member 213. The inert gas valve 215 is disposed at a center portion of the lid 214. The inert gas valve 215 is normally closed. The rear end flange 212*a* is airtightly connected to a peripheral portion of the workpiece inlet/output opening 330 of the front panel portion of the treatment apparatus main body 221 by the box holding mechanism 331. At this point, the lid 214 fits into the workpiece inlet/output opening 330.

On the other hand, the lid removing door mechanism 340 comprises an air cylinder 342, a support arm 344, and a flip type door 346. An upper end of the air cylinder 342 is pivoted to an inner surface of the front panel portion of the treatment apparatus main body 201 through a hinge 341. The support arm 344 is supported at a lower end of a piston rod of the air cylinder 342 so that the support arm 344 is vertically moved about a hinge 343. The flip type door 346 is fixed and supported by the support arm 344. The flip type door 346 securely closes the periphery of the workpiece inlet/output opening 330 through a seal member 345.

A protrusion 347 is integral with a front center portion of the flip type door 346 of the lid removing door mechanism 340. The protrusion 347 pushes and opens the gas valve 215 of the lid 214, which fits into the workpiece inlet/outlet opening 330. A solenoid valve 348 is disposed on the door 346. When the gas valve 215 is opened, the door 346 is opened by the solenoid valve 348. Thus, since the accommodating vessel 209 is connected to the treatment apparatus main body 201, the pressure in the accommodating vessel 209 becomes the same as the pressure in the treatment apparatus main body 201. A sucking disc portion 349 and a vacuum sucking nozzle 350 are disposed on the front surface of the protrusion 347 of the door 346. The nozzle 350 is connected to a sucking blower and so forth through a hose 351.

Next, the operation of the second modification of the third embodiment will be described. As with the operation of the third embodiment, the cassette 211, which contains a large number of semiconductor wafers 205, which are workpieces, is accommodated in the accommodating vessel 209. The accommodating vessel 209 is negatively pressured with the atmosphere of an inert gas (for example, $N_2$ gas). Thus, since the lid 214 is attracted to the box main body 212, the box main body 212 is sealed. In this condition, when the accommodating vessel 209 is conveyed by a proper conveying means, the accommodating vessel 209 is received by the support arm 335 of the box holding mechanism 331. The air cylinder 333 is raised. Thus, as shown in FIG. 25, the rear end flange 212*a* of the accommodating vessel 209 is airtightly and directly connected to the workpiece inlet/outlet opening 330 of the treatment apparatus main body 201.

The lid 214 of the accommodating vessel 209 is fitted to the workpiece inlet/outlet opening 330. Thus, the protrusion 347 of the lid removing door mechanism 340, which closes the inside of the workpiece inlet/outlet opening 330, pushes and opens the gas valve 215. At this point, the solenoid valve 348 is opened. Thus, the accommodating vessel 209 is connected to the treatment apparatus main body 201. Consequently, the pressure in the accommodating vessel 209 becomes the same as the pressure in the treatment apparatus main body 201. In addition, the sucking disc portion 349 on the front side of the protrusion 347 of the door 346 is connected to the lid 214. The vacuum sucking nozzle 350 sucks air so that the lid 214 is vacuum chucked.

In this condition, the cylinder 342 of the lid removing door mechanism 340 is raised. Thus, the door 346 and the lid 214 are flipped and opened toward the treatment apparatus main body 201 through the support arm 344.

Consequently, the box main body 212 of the accommodating vessel 209 is airtightly connected to the treatment apparatus main body 201. The semiconductor wafers 205 contained in the cassette 211 accommodated in the box main body 212 are transferred to the treatment apparatus main body 201 by the transfer unit 263, which is the transfer means. As shown in FIG. 19, the semiconductor wafers 205 are transferred to the wafer boat. The wafer boat is loaded into the treatment chamber so as to perform a predetermined treatment. The treated semiconductor wafers 205 are unloaded in the reverse order of the above-described operation and conveyed to the next treatment operation.

Thus, the workpieces can be loaded and unloaded into and from the treatment apparatus in the atmosphere of an inert gas without being exposed to air. Consequently, air (O2), gas impurities, and particle impurities can be easily and securely prevented from adhering to the workpieces and from entering the treatment apparatus. In the second modification, the above-described pass box can be omitted.

Figure 24:
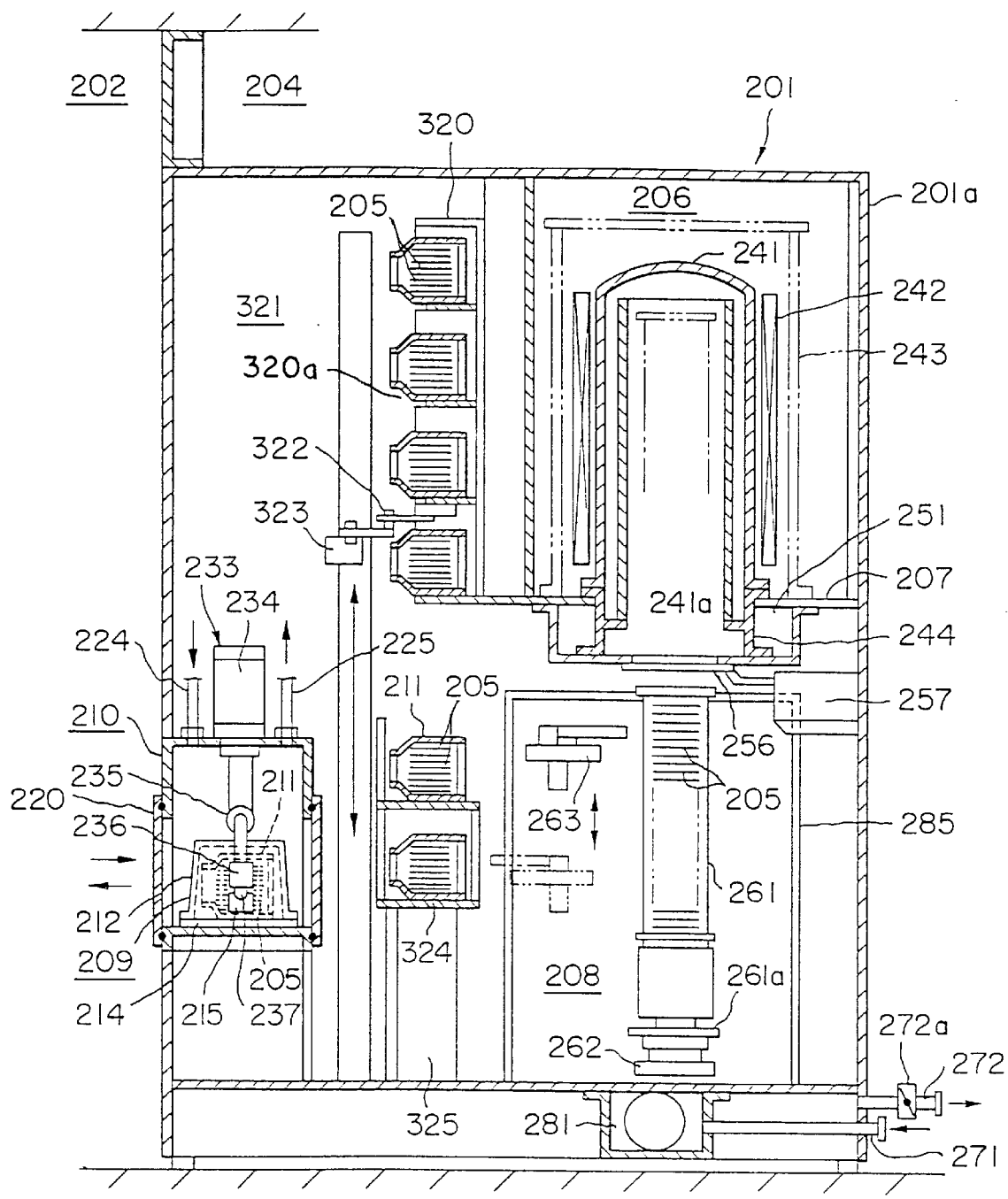
FIG. 24 is a vertical sectional view showing an upright type heat treatment apparatus according to a modification of the third embodiment of the present invention.

The construction of the second modification shown in FIG. 25 can be applied to the treatment apparatus with the cassette stock stage of the first modification shown in FIG. 24. In the second modification shown in FIG. 25, a mechanical clamp mechanism or a solenoid attracting system instead of the gas valve 215 of the accommodating vessel 209 may be used to open and close the box main body 212. In the lid removing door mechanism 340, the lid 214 may be held by a mechanical clamp or attracted by an electromagnetic attracting system rather than the vacuum chucking mechanism using the sucking disc portion so as to open and close the lid 214 along with the door 346.

In the above-mentioned third embodiment and the modifications thereof, the upright type heat treatment apparatus, which is used as an oxidizing apparatus and an CVD apparatus for forming insulating films on semiconductor wafers 205 as workpieces, were exemplified. However, it should be appreciated that the type of workpieces and the type of the treatment are not limited to those described in the third embodiment and the modifications thereof. In addition, depending on the type of the treatment, an inert gas other than $N_2$ gas may be supplied.

As described above, when the workpiece conveying box and the treatment apparatus according to the present invention are used, workpieces such as semiconductor wafers can be loaded and unloaded into and from the treatment apparatus in the atmosphere of an inert gas without being exposed to air. Thus, air (O2), gas impurities, and particle impurities can be prevented from adhering to the workpieces and form entering the treatment apparatus. Consequently, the consumption amount of the inert gas can be reduced. When the workpieces are loaded and unloaded into and from the treatment chamber, natural oxide film can be remarkably suppressed from taking place on the workpieces, impurities from adhering to the workpieces, and chemical contamination from taking place on the workpieces. Thus, according to the present invention, very economical and high performance can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A treatment apparatus, comprising:

a treatment chamber for performing a predetermined treatment for a workpiece contained in a holding member;

a loading chamber for loading and unloading the holding member containing the workpiece into and from said treatment chamber;

a pass box for temporarily storing an accommodating vessel conveyed from the outside of said treatment apparatus, said accommodating vessel including a main body, a lid for airtightly containing the workpiece, and a ventilation valve, the inside of the accommodating vessel being negatively pressured;

gas supply/exhaust means for substituting the atmosphere in said pass box with an inert gas;

a lid removing mechanism disposed in said pass box for removing the lid from the main body of the accommodating vessel, said lid removing mechanism including a valve operating portion for opening the ventilation valve of the accomodating vessel and lid separating means for separating the lid of the accomodating vessel from the main body of the accomodating vessel; and transferring means for transferring the workpiece contained in the accommodating vessel to said loading chamber.

2. A treatment apparatus, comprising:

a treatment chamber for performing a predetermined treatment for a workpiece contained in a holding member;

a loading chamber for loading and unloading the holding member containing the workpiece into and from said treatment chamber;

a pass box for temporarily storing an accommodating vessel conveyed from the outside of said treatment apparatus, said accommodating vessel including a main body, a lid and a ventilation valve, the accommodating vessel airtightly containing the workpiece and an inside of the accommodating vessel being negatively pressured;

gas supply/exhaust means for substituting the atmosphere in said pass box with an inert gas;

a lid removing mechanism disposed in said pass box and for removing the lid from the main body of the accommodating vessel, said lid removing mechanism including a valve operating portion for opening the ventilation valve and lid separating means for separating the lid from the main body;

transferring means for transferring the workpiece contained in the accommodating vessel from the pass box to said loading chamber; and circulating means for circulating a clean gas within said loading chamber.

* * * * *